US011501825B2

(12) United States Patent
Sako

(10) Patent No.: US 11,501,825 B2
(45) Date of Patent: Nov. 15, 2022

(54) SEMICONDUCTOR MEMORY DEVICE

(71) Applicant: Kioxia Corporation, Tokyo (JP)

(72) Inventor: Mario Sako, Yokohama Kanagawa (JP)

(73) Assignee: KIOXIA CORPORATION

( * ) Notice: Subject to any disclaimer, the term of this patent is extended or adjusted under 35 U.S.C. 154(b) by 0 days.

(21) Appl. No.: 17/349,106

(22) Filed: Jun. 16, 2021

(65) Prior Publication Data

US 2022/0246197 A1 Aug. 4, 2022

(30) Foreign Application Priority Data

Jan. 29, 2021 (JP) .............................. JP2021-013139

(51) Int. Cl.
| | |
|---|---|
| *G11C 16/06* | (2006.01) |
| *G11C 11/4091* | (2006.01) |
| *G11C 11/4094* | (2006.01) |
| *G11C 5/06* | (2006.01) |
| *G11C 11/4096* | (2006.01) |
| *G11C 11/4076* | (2006.01) |
| *G11C 11/4074* | (2006.01) |

(52) U.S. Cl.
CPC ............ *G11C 11/4091* (2013.01); *G11C 5/06* (2013.01); *G11C 11/4074* (2013.01); *G11C 11/4076* (2013.01); *G11C 11/4094* (2013.01); *G11C 11/4096* (2013.01)

(58) Field of Classification Search
CPC ... G11C 11/4091; G11C 5/06; G11C 11/4074; G11C 11/4076; G11C 11/4094; G11C 11/4096

USPC .................................................... 365/185.21
See application file for complete search history.

(56) References Cited

U.S. PATENT DOCUMENTS

| | | |
|---|---|---|
| 10,044,360 B2 | 8/2018 | Kris |
| 10,297,326 B2 | 5/2019 | Kamata et al. |
| 10,554,912 B2 | 2/2020 | Nagai et al. |
| 2017/0263325 A1 | 9/2017 | Kamata et al. |
| 2017/0365348 A1 | 12/2017 | Kamata et al. |
| 2019/0392905 A1* | 12/2019 | Hioka .................... G11C 16/30 |
| 2020/0213548 A1 | 7/2020 | Kim |
| 2021/0090661 A1 | 3/2021 | Sako |

FOREIGN PATENT DOCUMENTS

| | | |
|---|---|---|
| JP | 2017224374 A | 12/2017 |
| TW | 201801073 A | 1/2018 |

* cited by examiner

*Primary Examiner* — Huan Hoang
(74) *Attorney, Agent, or Firm* — Holtz, Holtz & Volek PC

(57) ABSTRACT

According to one embodiment, a semiconductor memory device includes a memory cell, a bit line, and a sense amplifier. The sense amplifier includes: a first node configured to be electrically coupled to the bit line; a first transistor in which a gate is coupled to the first node, and which is configured to be coupled to a second node; a second transistor configured to couple the second node and a third node; and a third transistor in which a gate is coupled to the third node, and which is configured to be coupled to the first node. The sense amplifier applies a second voltage obtained by amplifying a first voltage of the first node to the third node, and applies a third voltage obtained by amplifying the second voltage to the first node.

14 Claims, 16 Drawing Sheets

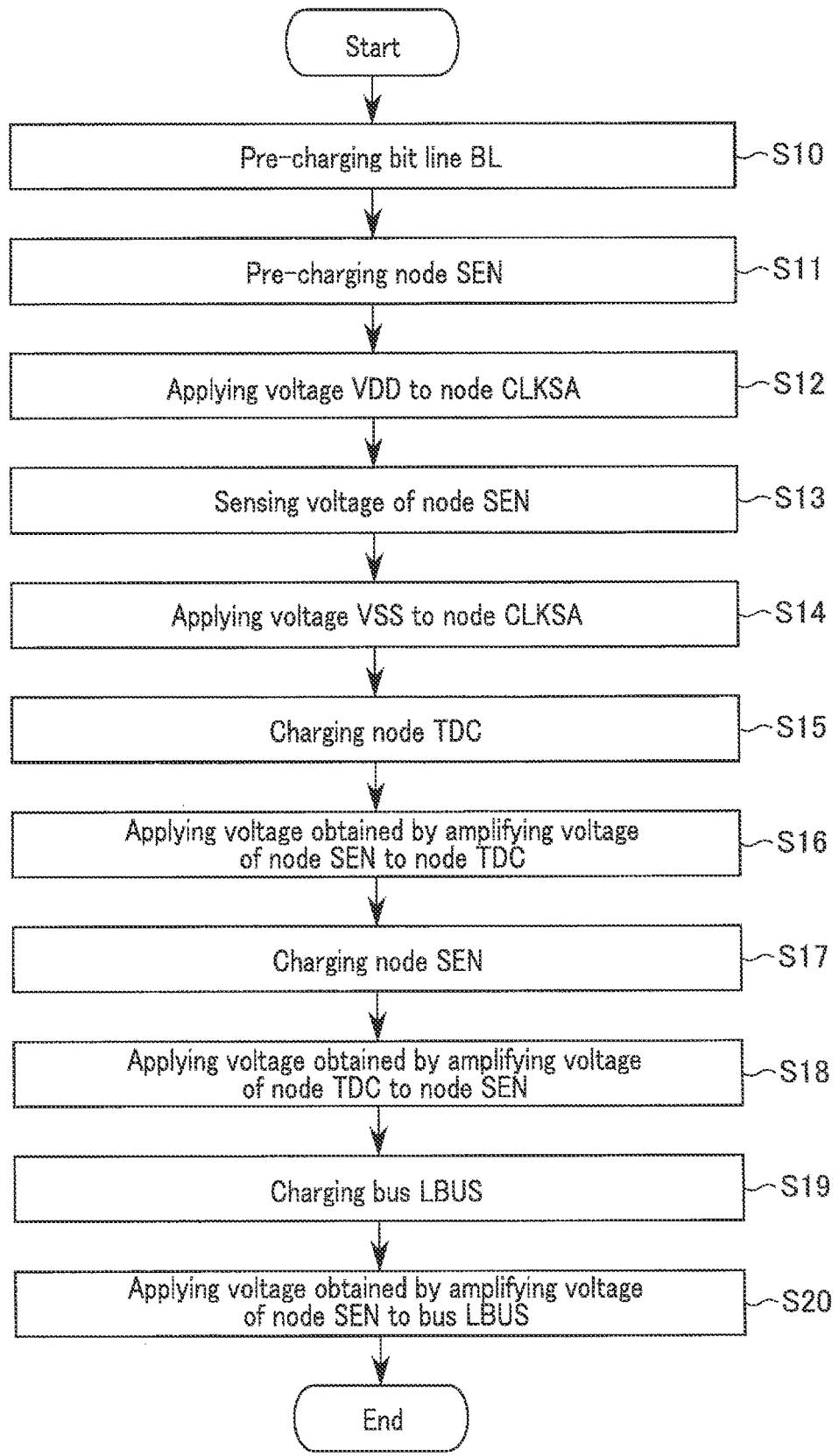
F I G. 6

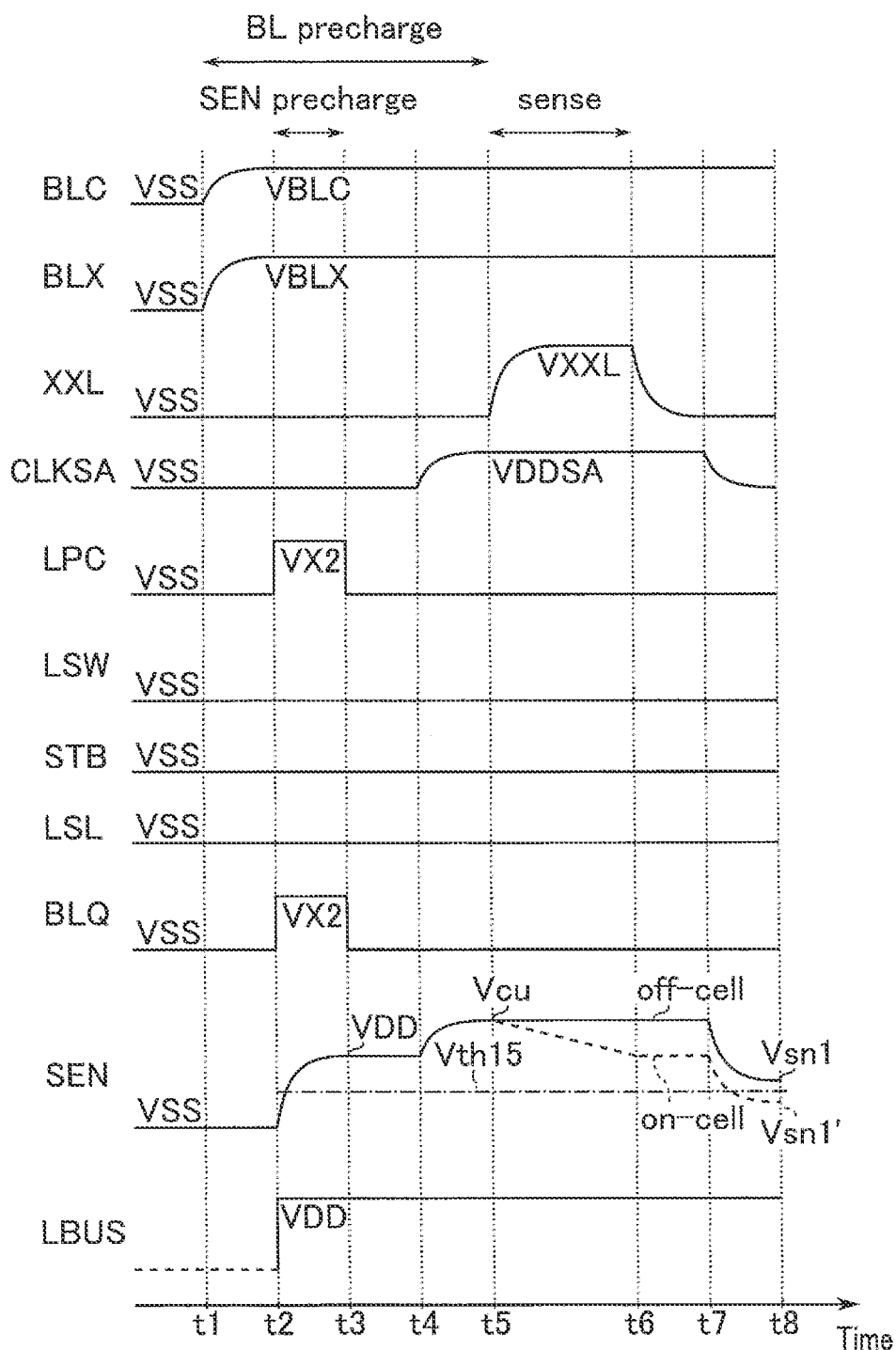
F I G. 15

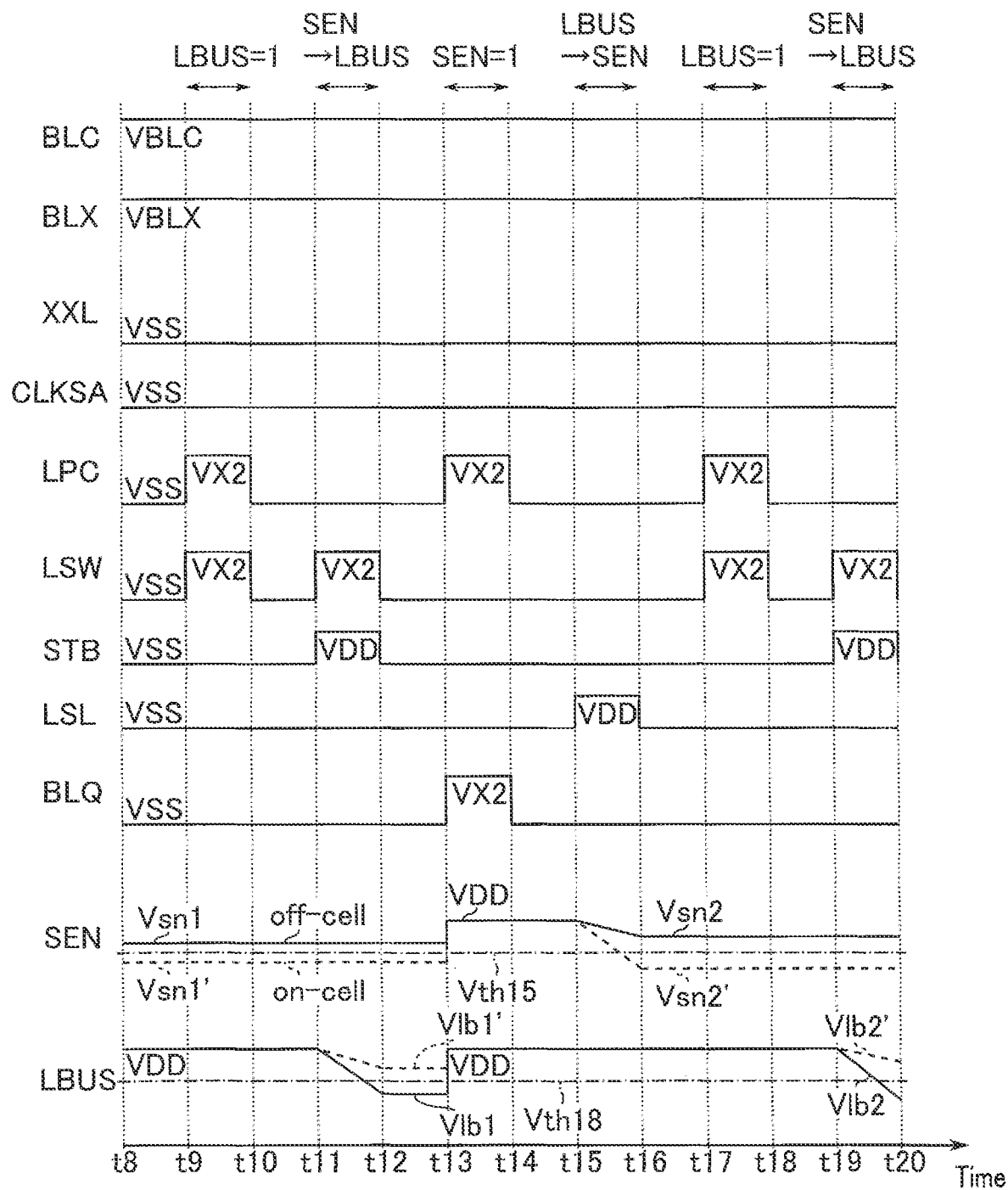
F I G. 16

SEMICONDUCTOR MEMORY DEVICE

CROSS-REFERENCE TO RELATED APPLICATIONS

This application is based upon and claims the benefit of priority from Japanese Patent Application No. 2021-013139, filed Jan. 29, 2021, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 6 is a flowchart showing a read operation of the NAND flash memory according to the first embodiment.

FIG. 15 is a timing chart showing voltages of various signals, etc. during the read operation of the NAND flash memory according to the fourth embodiment.

FIG. 16 is a timing chart showing voltages of various signals, etc. during the read operation of the NAND flash memory according to the fourth embodiment.

DETAILED DESCRIPTION

Figure 1:
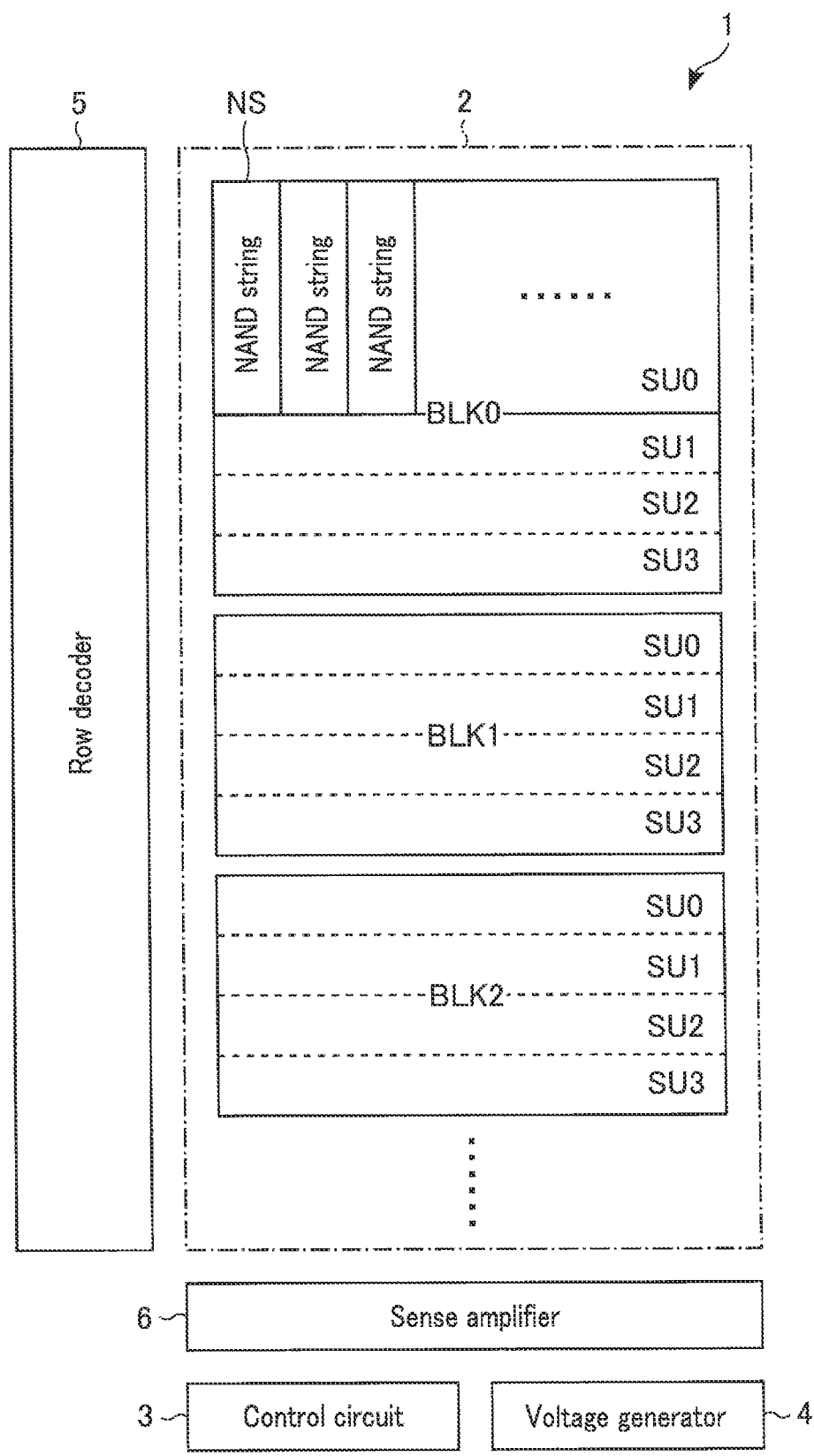
FIG. 1 is a block diagram of a NAND flash memory according to a first embodiment.

In general, according to one embodiment, a semiconductor memory device includes: a memory cell configured to store data; a bit line electrically coupled to the memory cell; and a sense amplifier electrically coupled to the bit line and including a first circuit and a latch circuit. The first circuit includes: a first node which is configured to be electrically coupled to the bit line; a first transistor in which a gate is coupled to the first node, and which is configured to be coupled to a second node coupled to the latch circuit; a second transistor configured to couple the second node and a third node; and a third transistor in which a gate is coupled to the third node, and which is configured to be coupled to the first node. The sense amplifier senses a first voltage of the first node at a time when charge is transferred to the bit line in a read operation, applies a second voltage obtained by amplifying the first voltage to the third node, and applies a third voltage obtained by amplifying the second voltage to the first node.

Hereinafter, embodiments will be described with reference to the drawings. In the description, common parts are assigned common reference numerals throughout the drawings.

1. First Embodiment

A semiconductor memory device according to a first embodiment will be described. By way of example, the following description will assume a semiconductor memory device to be a NAND flash memory.

1.1 Configuration

1.1.1 Overall Configuration of NAND Flash Memory

An overall configuration of a NAND flash memory according to the present embodiment will be described with reference to FIG. 1. FIG. 1 is a block diagram of the NAND flash memory according to the present embodiment.

A NAND flash memory 1 includes a memory cell array 2, a control circuit 3, a voltage generator 4, a row decoder 5, and a sense amplifier 6.

The memory cell array 2 includes a plurality of blocks BLK (BLK0, BLK1, BLK2, . . . ) each including nonvolatile memory cell transistors each associated with a row and a column. Each of the blocks BLK includes, for example, four string units SU (SU0 to SU3). Each of the string units SU includes a plurality of NAND strings NS. The number of blocks BLK in the memory cell array 2 and the number of string units SU in each block BLK is freely selected. The memory cell array 2 will be described in detail later.

The control circuit 3 controls operations of the entire NAND flash memory 1.

Under the control of the control circuit 3, the voltage generator 4 generates voltages for writing, reading, and erasing data, and applies the generated voltages to the row decoder 5 and the sense amplifier 6.

The row decoder 5 decodes a row address. For example, a row address is given by an external controller (not shown) which controls the NAND flash memory 1. Based on a result of decoding, the row decoder 5 selects one of the blocks BLK and further selects one of the string units SU. The row decoder 5 applies, to the selected block BLK, a voltage supplied from the voltage generator 4.

In a data read operation, the sense amplifier 6 senses data read from the memory cell array 2 and outputs read data to the controller. In a data write operation, the sense amplifier 6 transfers, to the memory cell array 2, write data received from the controller.

The NAND flash memory 1 configured as described in the above is coupled to the controller with a NAND interface (not shown) intervening therebetween. Specific examples of a signal transmitted and received between the controller and the NAND flash memory 1 include a chip enable signal CEn, a command latch enable signal CLE, an address latch enable signal ALE, a write enable signal WEn, read enable signals REn and RE, a write protect signal WPn, data strobe signals DQS and DQSn, an input/output signal DQ, and a ready/busy signal RBn. The controller controls the NAND flash memory 1 using these signals.

The signal CEn is a signal for enabling the NAND flash memory 1, and is asserted at, for example, a Low ("L") level. The term "assert" means that a signal (or logic) is in a valid (active) state. The signal CLE is a signal indicating that the signal DQ is a command, and is asserted at, for example, a High ("H") level. The signal ALE is a signal indicating that the signal DQ is an address, and is asserted at, for example, the "H" level. The signal WEn is a signal for fetching a received signal into the NAND flash memory 1, and is asserted at, for example, the "L" level. Every time the signal WEn is toggled, the NAND flash memory 1 fetches the signal DQ. The signals REn and RE are each a signal for the controller to read data from the NAND flash memory 1. The signal REn is an inversion signal of the signal RE. Every time the signals REn and RE are toggled, the NAND flash memory 1 outputs the signal DQ to the controller. The signal WPn is a signal for prohibiting a write or erase with respect to the NAND flash memory 1, and is asserted at, for example, the "L" level. The signals CEn, CLE, ALE, WEn, REn, RE, and WPn are each transmitted from the controller to the NAND flash memory 1.

The signals DQS and DQSn are used to control timing of transmitting and receiving the signal DQ. The signal DQSn is an inversion signal of the signal DQS. For example, when data is written, the signals DQS and DQSn along with the write data. DQ are transmitted from the controller to the NAND flash memory 1. The NAND flash memory 1 receives the write data DQ in synchronization with the signals DQS and DQSn. When data is read, the signals DQS and DQSn along with the read data DQ are transmitted from the NAND flash memory 1 to the controller. The signals DQS and DQSn are generated based on the aforementioned signal REn. The controller receives the read data DQ in synchronization with the signals DQS and DQSn.

The input/output signal DQ is, for example, an 8-bit signal. The input/output signal DQ is an entity of data transmitted and received between the NAND flash memory 1 and the controller. Examples of the input/output signal DQ include a command CMD, an address ADD, write data or read data DAT, and status information STS.

The signal RBn is a signal indicating whether the NAND flash memory 1 is in a busy state or in a ready state. For example, the ready/busy signal RBn is set to the "L" level when the NAND flash memory 1 is in the busy state. In the case of the signal RBn indicating the ready state, the NAND flash memory 1 is capable of receiving a command from the controller. In the case of the signal RBn indicating the busy state, the NAND flash memory 1 is incapable of receiving a command from the controller. The signal RBn is transmitted from the NAND flash memory 1 to the controller.

1.1.2 Circuit Configuration of Memory Cell Array 2

Figure 2:
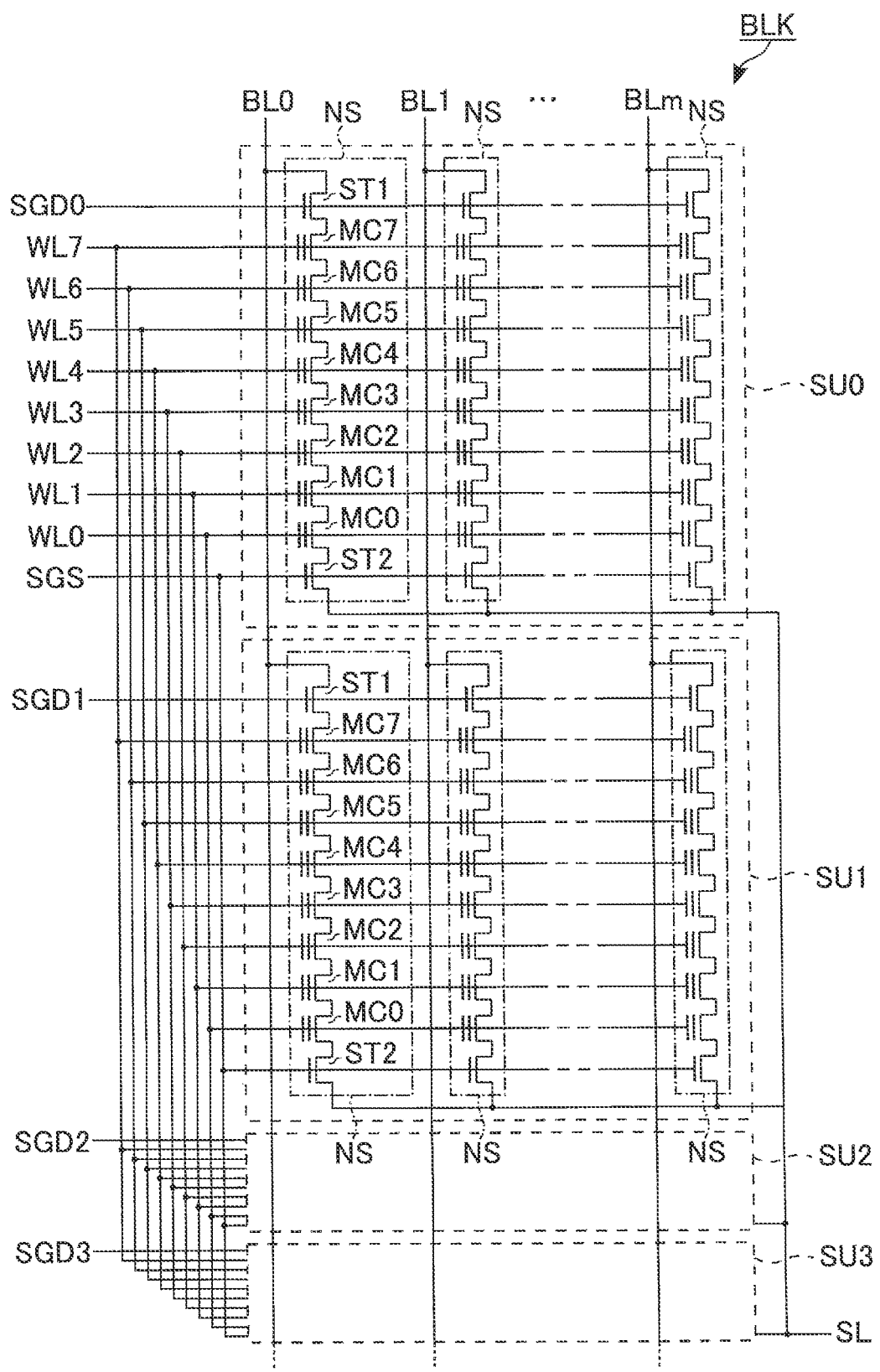
FIG. 2 is a circuit diagram of a memory cell array included in the NAND flash memory according to the first embodiment.

A circuit configuration of the memory cell array 2 will be described with reference to FIG. 2. FIG. 2 is a circuit diagram of the memory cell array 2 included in the NAND flash memory 1 according to the present embodiment.

FIG. 2 shows an exemplary circuit configuration of the memory cell array 2 by extracting one of the blocks BLK included in the memory cell array 2. All of the other blocks BLK also have the configuration shown in FIG. 2.

The plurality of NAND strings NS are respectively associated with bit lines BL0 to BLm (m is a natural number equal to or greater than 1). Each of the NAND strings NS includes, for example, memory cell transistors MC0 to MC7 and select transistors ST1 and ST2. Each of the memory cell transistors MC0 to MC7 includes a control gate and a charge storage layer, and stores data in a nonvolatile manner. The select transistors ST1 and ST2 are used to select a string unit SU in various operations.

In each NAND string NS, the memory cell transistors MC0 to MC7 are coupled in series. In the same block BLK, control gates of the memory cell transistors MC0 to MC7 included in the string units SU0 to SU3 are respectively coupled in common to word lines WL0 to WL7.

In each NAND string NS, a drain of the select transistor ST1 is coupled to an associated bit line BL, while a source of the select transistor ST1 is coupled to one end of the set of memory cell transistors MC0 to MC7 coupled in series. In the same block BLK, gates of the select transistors ST1 respectively included in the string units SU0 to SU3 are respectively coupled in common to select gate lines SGD0 to SGD3.

In each NAND string NS, a drain of the select transistor ST2 is coupled to the other end of the set of memory cell transistors MC0 to MC7 coupled in series. In the same block BLK, sources of the select transistors ST2 respectively included in the string units SU0 to SU3 are coupled in common to a source line SL, while gates of the select transistors ST2 respectively included in the string units SU0 to SU3 are coupled in common to a select gate line SGS.

In the circuit configuration of the memory cell array 2 described in the above, a bit line BL is shared among corresponding NAND strings NS in each block BLK, for example. The source line SL is shared among a plurality of blocks BLK, for example.

1.1.3 Threshold Voltage Distributions of Memory Cell Transistors MC

Figure 3:
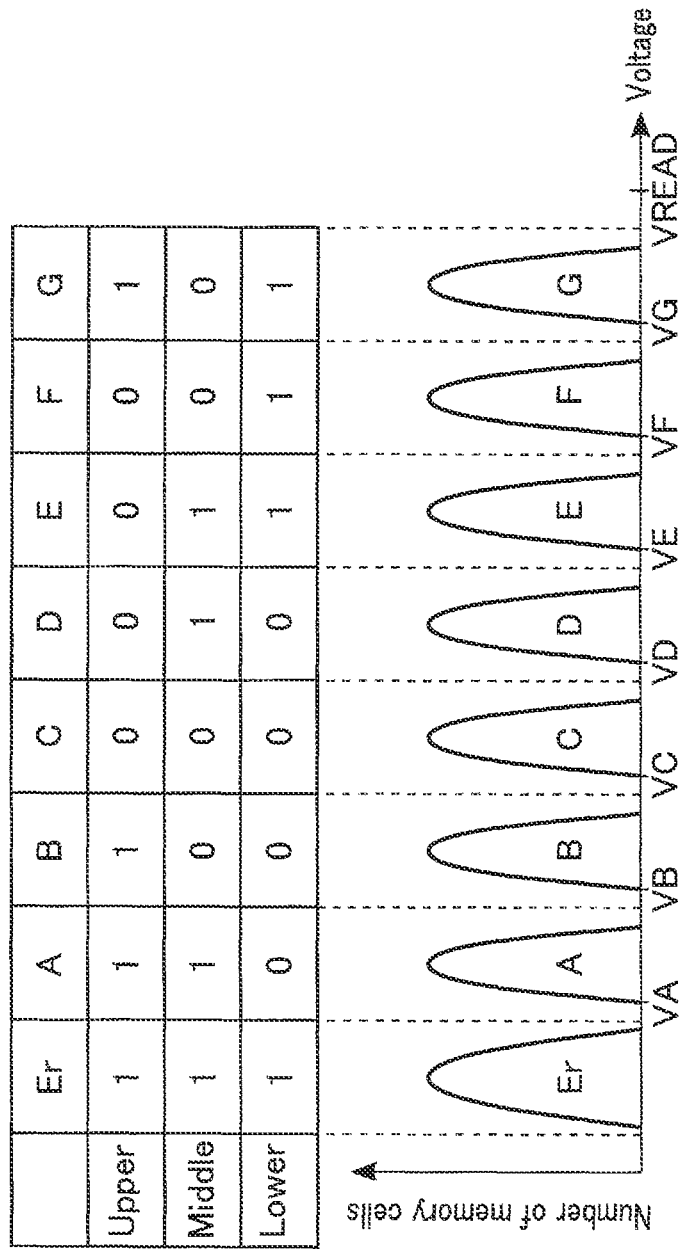
FIG. 3 is a threshold distribution diagram of memory cell transistors included in the NAND flash memory according to the first embodiment.

Threshold distributions that may be observed in the memory cell transistors MC will be described with reference to FIG. 3. FIG. 3 shows the threshold distributions observed in the memory cell transistors MC included in the NAND flash memory 1 according to the present embodiment. Hereinafter, the case in which one memory cell transistor MC can store octal data (three-bit data) will be described; however, the maximum data per memory cell transistor MC is not limited to octal data and may be quaternary data (two-bit data) or hexadecimal data (four-bit data).

A threshold voltage of each memory cell transistor MC takes on a value that falls within one of the eight discrete distributions. These eight threshold distributions are respectively called an "Er" level, an "A" level, a "B" level, a "C" level, a "D" level, an "E" level, an "F" level, and a "G" level from lower to higher thresholds.

The "Er" level corresponds to, for example, a data erased state. A threshold voltage included in the "Er" level is lower than voltage VA and takes on a positive or negative value.

The "A" to "G" levels correspond to a state in which data is written by injecting charge into a charge storage layer. A threshold voltage included in each of the "A" to "G" levels takes on, for example, a positive value. A threshold voltage included in the "A" level is equal to or greater than the voltage VA and lower than a voltage VB (>VA). A threshold voltage included in the "B" level is equal to or greater than the voltage VB and lower than a voltage VC (>VB). A threshold voltage included in the "C" level is equal to or greater than the voltage VC and lower than a voltage VD (>VC). A threshold voltage included in the "D" level is equal to or greater than the voltage VD and lower than a voltage VE (>VD). A threshold voltage included in the "E" level is equal to or greater than the voltage VE and lower than a voltage VF (>VE). A threshold voltage included in the "F" level is equal to or greater than the voltage VF and lower than a voltage VG (>VF). A threshold voltage included in the "G" level is equal to or greater than the voltage VG and lower than a voltage VREAD (>VG). The voltage VREAD is a voltage that is applied to a non-selected word line WL in a data read operation and a data write operation and turns on a memory cell transistor MC.

As stated above, each memory cell transistor MC belongs to one of the eight threshold distributions, thereby taking one of the eight states. By assigning these states to "000" to "111" in the binary system, each memory cell transistor MC is capable of storing three-bit data. Bits constituting this three-bit data will be referred to as a lower bit, a middle bit, and an upper bit, starting from the lower bit.

In the present embodiment, data allocation with respect to the "Er" to "G" levels will be expressed as follows. "111" indicates data at the "Er" level, "110" indicates data at the "A" level, "100" indicates data at the "B" level, "000" indicates data at the "C" level, "010" indicates data at the "B" level, "D" level, "011" indicates data at the "B" level, "001" indicates data at the "F" level, and "101" indicates data at the "G" level. The data allocation with respect to the respective levels may be set freely. In the example shown in FIG. 3, two adjacent threshold distributions are different only in one of the three bits constituting data. Accordingly, it suffices that reading of the lower bit uses a voltage corresponding to a boundary in which the value ("0" or "1") of the: lower bit varies; this also applies to reading of the middle bit and reading of the upper bit.

Reading of the lower bit uses, as a read voltage, the voltage VA, which distinguishes between the "Er" level and the "A" level, and the voltage VE, which distinguishes between the "D" level and the "E" level.

Reading of the middle bit uses, as a read voltage, the voltage VS, which distinguishes between the "A" level and the "B" level; the voltage VD, which distinguishes between the "C" level and the "D" level; and the voltage VF, which distinguishes between the "E" level and the "F" level.

Reading of the upper bit uses, as a read voltage, the voltage VC, which distinguishes between the "B" level and the "C" level, and the voltage VG, which distinguishes between the "F" level and the "G" level.

1.1.4 Configuration of Sense Amplifier 6

Figure 4:
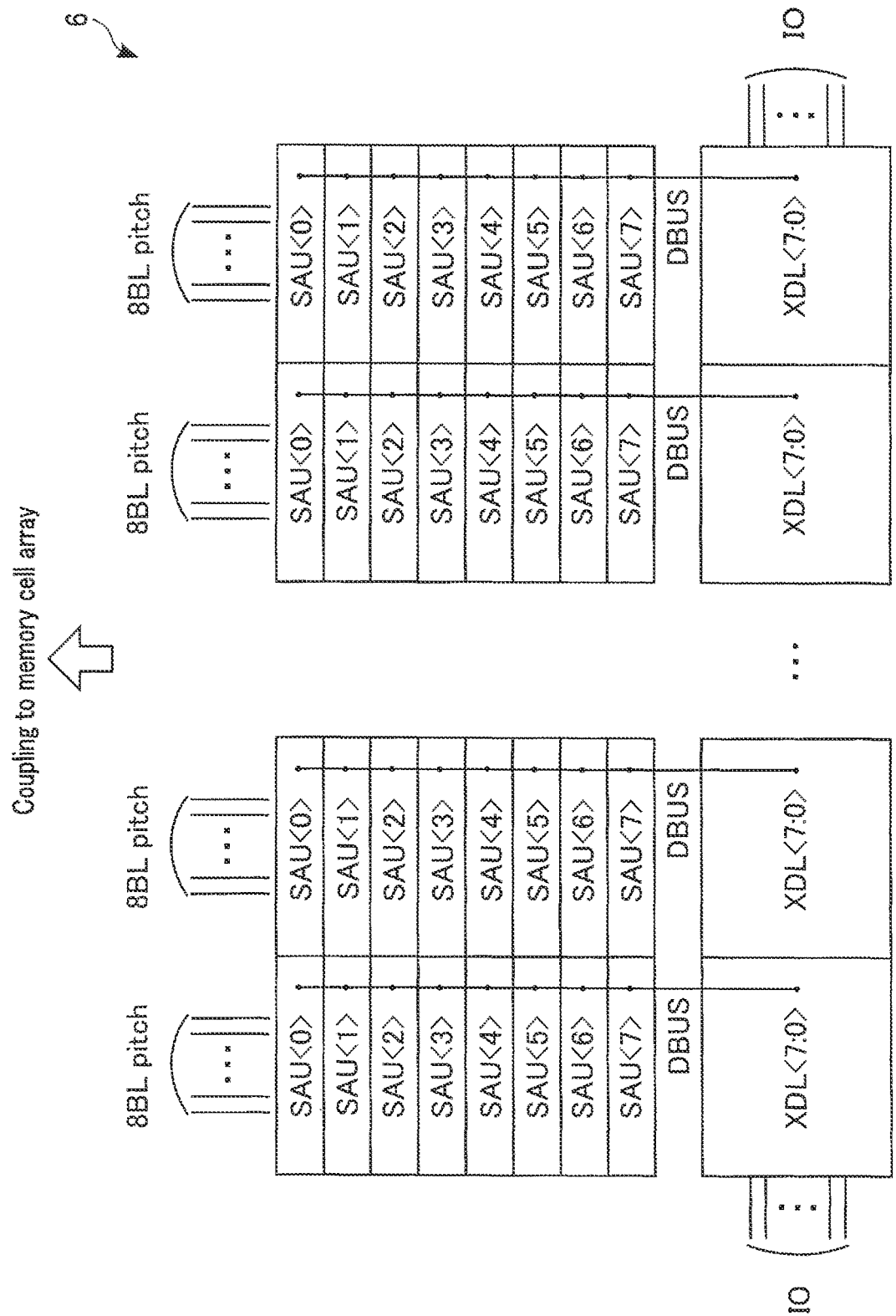
FIG. 4 is a block diagram of a sense amplifier included in the NAND flash memory according to the first embodiment.

A configuration of the sense amplifier 6 will be described with reference to FIG. 4. FIG. 4 is a block diagram of the sense amplifier 6 included in the NAND flash memory 1 according to the present embodiment.

The sense amplifier 6 includes a plurality of sense amplifier units SAU and a plurality of latch circuits XDL.

The sense amplifier units SAU are respectively provided for the bit lines BL. Each sense amplifier unit SAU senses data read out to a corresponding bit line BL in the data read operation and transfers write data to the corresponding bit line BL in the data write operation. In FIG. 4, the eight sense amplifier units SAU are coupled to the same single bus DBUS. The number of sense amplifier units SAU coupled to the same single bus DBUS is freely selected. In the description below, the eight sense amplifier units SAU coupled to the same single bus DBUS will be respectively expressed as SAU<0> to SAU<7> when they are distinguished from each other.

The latch circuits XDL are respectively provided for the sense amplifier units SAU. Each latch circuit XDL tempo-rarily stores data related to a corresponding bit line BL. In FIG. 4, a total of eight latch circuits XDL<7:0>, which respectively correspond to the sense amplifier units SAU<0> to SAU<7>, are coupled to the same single bus DBUS. Herein, the eight latch circuits XDL<7:0> may be respectively coupled to the eight buses DBUS. The respective latch circuits XDL are coupled to data lines IO. Each latch circuit XDL is used for data transmission and reception between a sense amplifier unit SAU and an exterior via a corresponding bus DBUS and a corresponding data line IO. Namely, data received from, for example, the controller, is first stored in the latch circuit XDL via the data line IO and is then transferred to the sense amplifier unit SAU via the bus DBUS, and vice versa.

1.1.5 Circuit Configuration of Sense Amplifier Unit SAU

Figure 5:
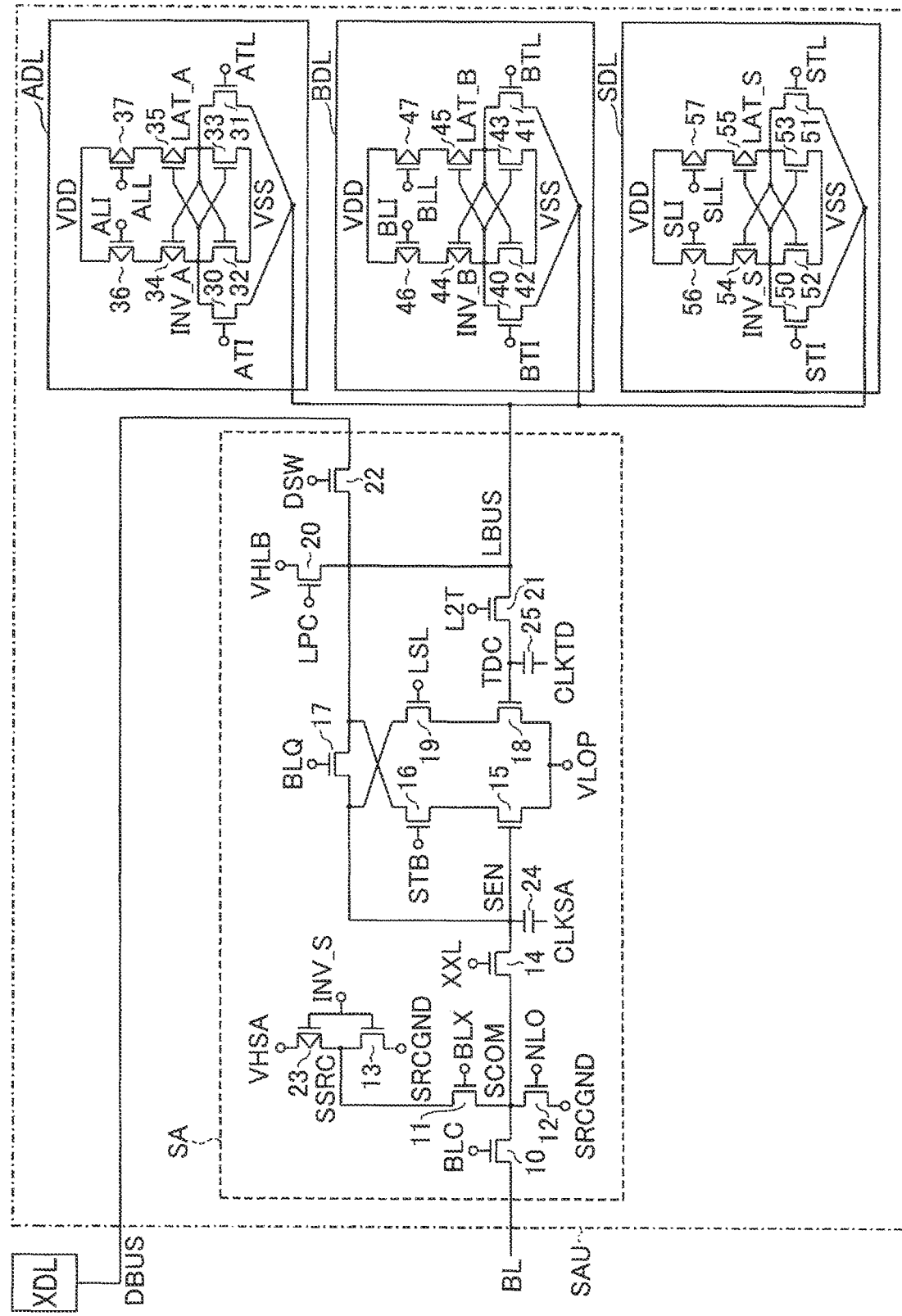
FIG. 5 is a circuit diagram of a sense amplifier unit included in the NAND flash memory according to the first embodiment.

A circuit configuration of the sense amplifier unit SAU will be described with reference to FIG. 5. FIG. 5 is circuit diagram of the sense amplifier unit SAU included in the NAND flash memory 1 according to the present embodiment. The sense amplifier units SAU described as an example: in the present embodiment take a current-sensing form which senses a current flowing through bit lines BL; however, the sense amplifier units SAU in a voltage-sensing form may be used.

FIG. 5 shows an exemplary circuit configuration of the sense amplifier unit SAU by extracting one of the sense amplifier units SAU included in the sense amplifier 6. All of the other sense amplifier units SAU also have the configuration shown in FIG. 5.

Each of the sense amplifier units SAU includes a sense circuit SA and three latch circuits (SDL, ADL, and BDL).

When data is read, the sense circuit SA senses data read out to the bit line BL, and determines whether the read data is "0" or "1". When data is written, the sense circuit SA applies a voltage to the bit line BL based on write data. The sense circuit SA performs an AND operation or OR operation using data stored in the latch circuits SDL, ADL, and BDL.

The sense circuit SA will be described in detail. Regarding a source and a drain of a transistor, hereinafter, one of them will be referred to as "one end of a current path" and the other will be referred to as "the other end of the current path".

The sense circuit SA includes n-channel MOS transistors 10 to 22, a p-channel MOS transistor 23, and capacitance elements 24 and 25.

The transistor 10 is configured in such a manner that a signal BLC is input to a gate, and one end of a current path is coupled to a corresponding bit line BL and the other end of the current path is coupled to a node SCOM. The transistor 10 is for clamping a corresponding bit line BL to a voltage corresponding to the signal BLC.

The transistor 11 is configured in such a manner that a signal BLX is input to a gate, and one end of a current path is coupled to the node SCOM and the other end of the current path is coupled to a node SSRC. The transistor 12 is configured in such a manner that a signal NLO is input to a gate, and one end of a current path is coupled to the node SCOM and the other end of the current path is coupled to a node SRCGND. For example, a ground voltage VSS is applied to the node SRCGND. The transistor 12 is for charging or discharging a corresponding bit line BL. The transistor 13 is configured in such a manner that a gate is coupled to a node INV_S, and one end of a current path is coupled to the node SSRC and the other end of the current path is coupled to the node SRCGND. The transistor 14 is configured in such a manner that a signal XXL is input to a gate, and one end of a current path is coupled to the node SCOM and the other end of the current path is coupled to a node SEN. The transistor 14 is for controlling a period of sensing data in a memory cell transistor MC. When data is read, the node SEN functions as a sense node for sensing data in a memory cell transistor MC which is a read target. More specifically, when data is read, charge pre-charged into the node SEN (and the capacitance element 24) is transferred to the bit line BL in accordance with whether the memory cell transistor MC which is a read target is turned on or off. Data is read by sensing a voltage of the node SEN at this time.

The transistor 15 is configured in such a manner that a gate is coupled to the node SEN, and one end of a current path is coupled to one end of a current path of the transistor 16 and a voltage VLOP is applied to the other end of the current path of the transistor 15. The voltage VLOP is, for example, the ground voltage VSS. The transistor 16 is configured in such a manner that a signal STB is input to a gate, and the other end of a current path is coupled to a bus LBUS. The transistor 17 is configured in such a manner that a signal BLQ is input to a gate, and one end of a current path is coupled to the node SEN and the other end of the current path is coupled to the bus LBUS. The transistor 18 is configured in such a manner that a gate is coupled to a node TDC and one end of a current path is coupled to one end of a current path of the transistor 19 and the voltage VLOP is applied to the other end of the current path of the transistor 18. The transistor 19 is configured in such a manner that a signal LSL is input to a gate, and the other end of the current path is coupled to the node SEN.

The transistor 20 is configured in such a manner that a signal LPC is input to a gate, and one end of a current path is coupled to the bus LBUS and a voltage VHLB is applied to the other end of the current path. The voltage VHLB is, for example, a power supply voltage VDD. The voltage VHLB is transferred to the bus LBUS by turning on the transistor 20, and the bus LBUS is pre-charged in this manner.

The transistor 21 is configured in such a manner that a signal L2T is input to a gate, and one end of a current path is coupled to the node TDC and the other end of the current path is coupled to the bus LBUS.

The transistor 22 is configured in such a manner that a signal DSW is input to a gate, and one end of a current path is coupled to the bus LBUS and the other end of the current path is coupled to the bus DBUS. The transistor 22 is a bus switch for coupling the bus LBUS and the bus DBUS. With this bus switch, the sense circuit SA and the latch circuit XDL are coupled to each other.

The transistor 23 is configured in such a manner that a gate is coupled to the node INV_S, and a voltage VHSA is applied to one end of a current path and the other end of the current path is coupled to the node SSRC. The voltage VHSA is, for example, the power supply voltage VDD.

The capacitance element 24 has one electrode coupled to the node SEN and the other electrode coupled to a node CLKSA. A clock is input to the node CLKSA.

The capacitance element 25 has one electrode coupled to the node TDC and the other electrode coupled to a node CLKTD. A clock is input to the node CLKTD.

The latch circuits SDL, ADL, and BDL temporarily store data. In a data write operation, the sense circuit SA controls a bit line BL according to data stored in the latch circuit SDL. The other latch circuits ADL and BDL are used to temporarily store data of each bit when the individual memory cell transistors MC store data composed of two or more bits, for example. The number of latch circuits is freely selectable. For example, the number of latch circuits is selected in accordance with the maximum amount of data (i.e., the number of bits) that can be stored in each memory cell transistor MC.

The latch circuit SDL includes n-channel MOS transistors 50 to 53 and p-channel MOS transistors 54 to 57.

The transistor 50 is configured in such a manner that a signal STI is input to a gate, and one end of a current path is coupled to the bus LBUS and the other end of the current path is coupled to the node INV_S. The transistor 51 is configured in such a manner that a signal STL is input to a gate, and one end of a current path is coupled to the bus LBUS and the other end of the current path is coupled to a node LAT_S. The transistor 52 is configured in such a manner that a gate is coupled to the node LAT_S, and one end of a current path is grounded and the other end of the current path is coupled to the node INV_S. The transistor 53 is configured in such a manner that a gate is coupled to the node INV_S, and one end of a current path is grounded and the other end of the current path is coupled to the node LAT_S. The transistor 54 is configured in such a manner that a gate is coupled to the node LAT_S, and one end of a current path is coupled to the node INV_S. The transistor 55 is configured in such a manner that a gate is coupled to the node INV_S, and one end of a current path is coupled to the node LAT_S. The transistor 56 is configured in such a manner that a signal SLI is input to a gate, and one end of a current path is coupled to the other end of the current path of the transistor 54 and the power supply voltage VDD is applied to the other end of the current path of the transistor 56. The transistor 57 is configured in such a manner that a signal SLL is input to a gate, and one end a current path is coupled to the other end of the current path of the transistor 55 and the power supply voltage VDD is applied to the other end of the current path of the transistor 57.

In the latch circuit SDL, the transistors 53 and 55 form a first inverter, while the transistors 52 and 54 form a second inverter. An output of the first inverter and an input of the second inverter (node LAT_S) are coupled to the bus LBUS with the transistor 51 for data transfer intervening therebetween, while an input of the first inverter and an output of the second inverter (node INV_S) are coupled to the bus LBUS with the transistor 50 for data transfer intervening therebetween. The latch circuit SDL stores data in the node LAT_S, and stores its inversion data in the node INV_S.

Detailed descriptions for the configurations of the latch circuits ADL and BDL will be omitted because their configurations are similar to the configuration of the latch circuit SDL. However, their transistors and signals will be described under different reference numbers and names from those of the latch circuit SDL, as shown in FIG. 5. Namely, the transistors 30 to 37 in the latch circuit ADL and the transistors 40 to 47 in the latch circuit BDL respectively correspond to the transistors 50 to 57 in the latch circuit SDL. Signals ATI and BTI as well as signals ATL and BTL respectively correspond to signals STI and STL. Signals ALT and BLI as well as signals ALL and BLL respectively correspond to signals SLI and SLL. In each of the sense amplifier units SAU, the sense circuit SA and the three latch circuits SDL, ADL, and BDL are coupled to each other with the bus LBUS intervening therebetween in such a manner that data can be transmitted and received therebetween.

In each of the sense amplifier units SAU configured as described in the above, various signals are provided by, for example, the control circuit 3.

1.2 Read Operation

Figure 7:
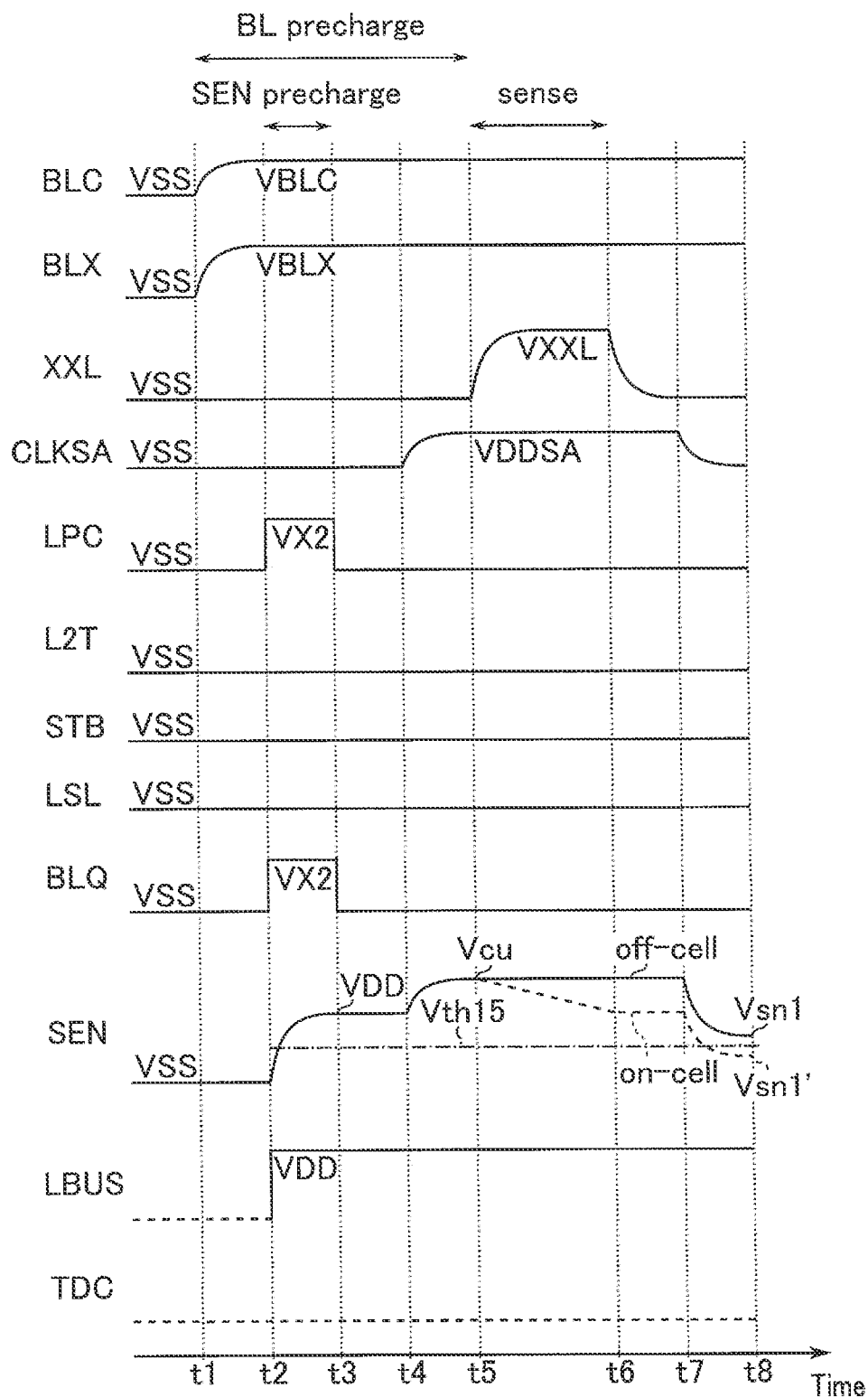
FIG. 7 is a timing chart showing voltages of various signals, etc. during the read operation of the NAND flash memory according to the first embodiment.
Figure 8:
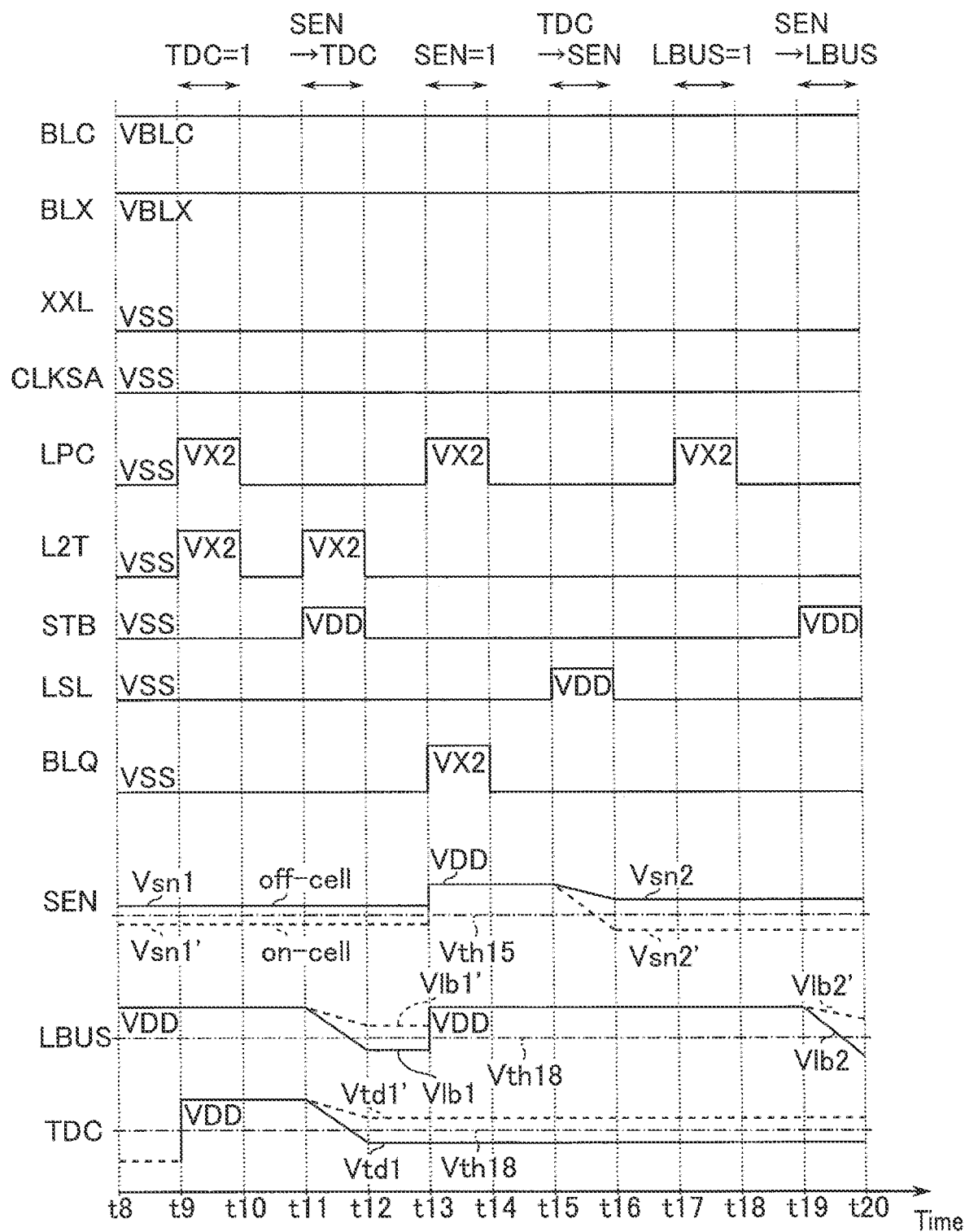
FIG. 8 is a timing chart showing voltages of various signals, etc. during the read operation of the NAND flash memory according to the first embodiment.

A read operation of the NAND flash memory 1 according to the present embodiment will be described with reference to FIG. 6 to FIG. 8. FIG. 6 is a flowchart showing a read operation of the NAND flash memory 1 according to the present embodiment. FIGS. 7 and 8 are each a timing chart showing voltages of various signals, etc., during a read operation of the NAND flash memory 1 according to the present embodiment. In the present embodiment, the read operation is performed by pre-charging the node SEN within the sense circuit SA, transferring charge pre-charged into the node SEN to the bit line BL, and thereafter performing digitizing. Throughout this description, "digitizing" indicates that the sense amplifier 6 senses a voltage of the node SEN (data read out to the bit line BL), and converts a signal of the sensed analog-level voltage into logical data at the "L" level or the "H" level (digital signal).

When the memory transistor MC which is a read target is selected, the sense amplifier 6 pre-charges the bit line BL (S10). As shown in FIG. 7, at time t1, the control circuit 3 raises a signal BLC from the "L" level (VSS) to the "H" level (VBLC), and raises a signal BLX from the "L" level (VSS) to the "H" level (VBLX). The voltage VBLC is a voltage for clamping a voltage of the bit line BL. The voltage VBLX is a voltage that enables the transistor 11 to transfer the voltage VDD. The voltage VBLX is higher than the voltage VBLC. In this manner, the transistors 10 and 11 are turned on, and the bit line BL is pre-charged. Pre-charging of the bit line BL is conducted during a period from time t1 to time t5.

During pre-charging of the bit line BL, the sense amplifier 6 pre-charges the node SEN (S11). As shown in FIG. 7, at time t2, the control circuit 3 raises the signals LPC and BLQ from the "L" level (VSS) to the "H" level (VX2). The voltage VX2 is a voltage that enables the transistors 17, 20, and 21 to transfer the voltage VDD. In this manner, the transistors 17 and the 20 are turned on, and the node SEN and the bus LBUS are pre-charged to the "H" level (VDD). At time t3, the control circuit 3 drops the signals LPC and BLQ from the "H" level (VX2) to the "L" level (VSS). Accordingly, the transistors 17 and 20 are turned off, and the node SEN and the bus LBUS are maintained at the "H" level. The bus LBUS takes on a given value within a range of VSS or greater and VDD or lower during a period from time t1 to time t2.

When the node SEN is pre-charged, the control circuit 3 applies the voltage VDDSA to the node CLKSA (S12, hereinafter, this will be referred to as "clock up"). The voltage VDDSA is, for example, a power supply voltage VDD. As shown in FIG. 7, at time t4, the control circuit 3 raises the voltage of the node CLKSA from the "L" level (VSS) to the "H" level (VDDSA). As a result, the capacitance element 24 is charged, and a voltage of the node SEN rises to a voltage Vcu under the effect of capacitance coupling. The voltage Vcu is a voltage of the node SEN which has risen due to clock up and is higher than the voltage VDD.

After the clock up is performed, the sense amplifier 6 senses a voltage of the node SEN (S13). As shown in FIG. 7, at time t5, the control circuit 3 raises the signal XXL from the "L" level (VSS) to the "H" level (VXXL). The voltage VXXL is higher than the voltage VBLX. In this state, in the case where a threshold voltage of the memory cell transistor MC which is a read target is equal to or greater than a read voltage (for example. VA, VB, VC, . . . ), the memory cell transistor MC is turned off (hereinafter, such a memory cell transistor MC will be referred to as an "off-cell"), and a current flows very little from a corresponding bit line BL to the source line SL. Therefore, a charge charged into the node SEN is discharged very little, and a voltage of the node SEN fluctuates very little. On the other hand, in the case where a threshold voltage of the memory cell transistor MC which is a read target is lower than a read voltage, the memory cell transistor MC is turned on (hereinafter, such a memory cell transistor MC will be referred to as an "on-cell"), and a current flows from a corresponding bit line BL to the source line SL. Since the voltage VXXL is higher than the voltage VBLX, a charge charged into the node SEN is discharged. That is, the node SEN significantly decreases in voltage. At time t6, the control circuit 3 drops the signal XXL from the "H" level (VXXL) to the "L" level (VSS).

When a voltage of the node SEN is sensed, the control circuit 3 applies the voltage VSS to the node CLKSA (S14, hereinafter, this will be referred to as "clock up"). As shown in FIG. 7, at time t7, the control circuit 3 drops a voltage of the node CLKSA from the "H" level (VDDSA) to the "L" level (VSS). As a result, a voltage of the node SEN decreases under the effect of capacitance coupling. Specifically, in the case where a threshold voltage of the transistor 15 is referred to as Vth15, a voltage of the node SEN corresponding to the off-cell becomes Vsn1 (Vth15 or greater and VDD or lower), as shown in FIG. 7. Furthermore, a voltage of the node SEN corresponding to the on-cell becomes Vsn1' (VSS or greater and lower than Vth15).

After the clock down is performed, the sense amplifier 6 charges the node TDC (S15). As shown in FIG. 8, at time t9, the control circuit 3 raises the signals LPC and L2T from the "L" level (VSS) to the "H" level (VX2). Accordingly, the transistors 20 and 21 are turned on, and the node TDC and the bus LBUS are charged to the "H" level (VDD). At time t10, the control circuit 3 drops the signals LPC and L2T from the "H" level (VX2) to the "L" level (VSS). Accordingly, the transistors 20 and 21 are turned off, and the node TDC and the bus LBUS are maintained at the "H" level. The node TDC takes on a value of VSS or greater and VDD or lower during a period from time t1 to time t9.

When the node TDC is charged, the sense amplifier 6 applies, to the node TDC, a voltage obtained by amplifying a voltage of the node SEN (S16). As shown in FIG. 8, at time t11, the control circuit 3 raises the signal L2T from the "L" level (VSS) to the "H" level (VX2), and raises the signal STB from the "L" level (VSS) to the "H" level (VDD). Accordingly, the transistors 16 and the 21 are turned on. As a result, the transistor 15 corresponding to the off-cell is turned to a weak ON state based on a voltage difference between the voltage Vth15 and the voltage Vsn1, and the bus LBUS and the node TDC decrease in voltage. Voltages of the LBUS and the node TDC at this time are respectively referred to as Vlb1 and Vtd1. The voltages Vtd1 and Vsn1 satisfy the relation of Vtd1>Vsn1. On the other hand, the transistor 15 corresponding to the on-cell is turned to a weak OFF state based on a voltage difference between the voltage Vsn1' and the voltage Vth15, and the bus LBUS and the node TDC are maintained roughly at the voltage VDD (or have a slight decrease in voltage). Voltages of the LBUS and the node TDC at this time are respectively referred to as Vlb1' and Vtd1'. The voltages Vtd1' and Vsn1' satisfy the relation of Vtd1'>Vsn1'. As a result, a voltage difference between the voltage Vth15 and the voltage Vsn1 and a voltage difference between the voltage Vth15 and the voltage Vsn1' are respectively amplified. In other words, a voltage difference between the voltage Vsn1 and the voltage Vsn1' is amplified to a voltage difference between the voltage Vdt1 and the voltage Vtd1'. At time t12, the control circuit 3 drops the signal L2T from the "H" level (VX2) to the "L" level (VSS), and drops the signal STB from the "H" level (VDD) to the. "L" level (VSS). Accordingly, the transistors 16 and 21 are turned off, and a voltage of the node TDC is maintained.

When a voltage obtained by amplifying a voltage of the node SEN is applied to the node TDC, the sense amplifier 6 charges the node SEN (S17). As shown in FIG. 8, at time t13, the control circuit 3 raises the signals LPC and BLQ from the "L" level (VSS) to the "H" level (VX2). Accordingly, the transistors 17 and 20 are turned on, and the node SEN and the bus LBUS are charged to the "H" level (VDD). At time t14, the control circuit 3 drops the signals LPC and BLQ from the "H" level (VX2) to the "L" level (VSS). Accordingly, the transistors 17 and 20 are turned off, and the node SEN and the bus LBUS are maintained at the "H" level.

When the node SEN is charged, the sense amplifier 6 applies, to the node SEN, a voltage obtained by amplifying a voltage of the node TDC (S18). As shown in FIG. 8, at time t15, the control circuit 3 raises the signal LSL from the "L" level (VSS) to the "H" level (VDD). Accordingly, the transistor 19 is turned on. As a result, the transistor 18 corresponding to the off-cell is turned on based on a voltage difference between the voltage Vtd1 and the voltage Vth18 of the transistor 18, and the node SEN decreases in voltage. A voltage of the node SEN at this time will be referred to as Vsn2. The voltages Vsn2 and Vtd1 satisfy the relation of Vsn2>Vtd1. On the other hand, the transistor 18 corresponding to the on-cell is turned off based on a voltage difference between the voltage Vtd1' and the voltage Vth18, and the node SEN is maintained roughly at the voltage VDD. A voltage of the node SEN at this time will be referred to as Vsn2'. The voltages Vsn2' and Vtd1' satisfy the relation of Vsn2'>Vtd1'. As a result, a voltage difference between the voltage vsn1 and the voltage Vsn1' is amplified (for example, amplified 100 times) to a voltage difference between the voltage Vsn2 and the voltage Vsn2'. Hereinafter, "an operation of amplifying a voltage of the node SEN" will refer to the operation of applying, to the node TDC, a voltage obtained by amplifying a voltage of the node SEN, and then applying, to the node SEN, a voltage obtained by amplifying a voltage of the node TDC. At time t16, the control circuit 3 drops the signal LSL from the "H" level (VDD) to the "L" level (VSS). Accordingly, the transistor 19 is turned off, and a voltage of the node SEN is maintained.

When a voltage obtained by amplifying a voltage of the node TDC is applied to the node SEN, the sense amplifier 6 charges the bus LBUS (S19). As shown in FIG. 8, at time t17, the control circuit 3 raises the signal LPC from the "L" level (VSS) to the "H" level (VX2). Accordingly, the transistor 20 is turned on, and the bus LBUS is charged to the "H" level (VDD). At time t18, the control circuit 3 drops the signal LPC from the "H" level (VX2) to the "L" level (VSS). Accordingly, the transistor 20 is turned off, and the bus LBUS is maintained at the "H" level.

When the bus LBUS is charged, the sense amplifier 6 applies, to the bus LBUS, a voltage obtained by amplifying a voltage of the node SEN (S20). As shown in FIG. 8, at time t19, the control circuit 3 raises the signal STB from the "L" level (VSS) to the "H" level (VDD). Accordingly, the transistor 16 is turned on. As a result, the transistor 15 corresponding to the off-cell is turned on based on a voltage difference between the voltage Vsn2 and the voltage Vth15, and the bus LBUS decreases in voltage. A voltage of the bus LBUS at this time will be referred to as Vlb2. The voltages Vlb1 and Vlb2 satisfy the relation that Vlb1 is equal to or greater than Vlb2. On the other hand, the transistor 15 corresponding to the on-cell is turned off based on a voltage difference between the voltage Vsn2' and the voltage Vth15, and the bus LBUS is maintained roughly at the voltage VDD. A voltage of the bus LBUS at this time will be referred to as Vlb2'. The voltages Vlb1' and Vlb2' satisfy the relation that Vlb2' is equal to or greater than Vlb1'. At time t20, the control circuit 3 drops the signal STB from the "H" level (VDD) to the "L" level (VSS). Accordingly, the transistor 16 is turned off, and a voltage of the bus LBUS is maintained. As a result, a logical level of read data is confirmed. In the case where a voltage of the bus LBUS is the voltage Vlb2, it is determined that the bus LBUS stores data at the "L" level. In the case where a voltage of the bus LBUS is the voltage Vlb2', it is determined that the bus LBUS stores data at the "H" level. That is, digitizing of read data is completed.

When a logical level of read data is confirmed, a logical operation using the confirmed logical level (for example, an AND operation or OR operation on the confirmed logical level and data of the latch circuit ADL, an AND operation or OR operation on the confirmed logical level and data of the latch circuit BDL, etc.) is performed. The confirmed logical level may be transferred to the latch circuit XDL.

1.3 Advantageous Effects

With the configuration according to the present embodiment, the sense circuit SA includes the node TDC for temporarily storing data. In a read operation, the sense amplifier 6 performs an operation of amplifying a voltage of the node SEN, thereby amplifying a voltage difference between the voltage of the node SEN and a threshold voltage of the transistor 15 having its gate coupled to the node SEN. The sense amplifier 6 performs digitizing based on the amplified voltage difference. Using the node TDC instead of the latch circuits (SDL, ADL, and BDL) enables digitizing to be performed without controlling the latch circuits and transmitting and receiving data between the latch circuits and the sense circuit SA. This achieves reduction of a time required for digitizing. Accordingly, a speed of operations of the NAND flash memory 1 can be enhanced. Furthermore, since the node TDC can be used instead of a latch circuit, digitizing can be performed without increasing the number of latch circuits. This prevents the NAND flash memory 1 from increasing in area.

In addition, a voltage difference between a voltage of the node SEN and a threshold voltage of the transistor 15 having its gate coupled to the node SEN can be amplified. This makes it possible to prevent an erroneous determination at the time of digitizing.

2. Second Embodiment

The second embodiment will be described. The NAND flash memory 1 according to the present embodiment has the same configuration as that of the first embodiment. In the present embodiment, the operation of amplifying a voltage of the node SEN in the first embodiment is performed twice. Hereinafter, the points different from the first embodiment will be mainly described.

2.1 Read Operation

Figure 9:
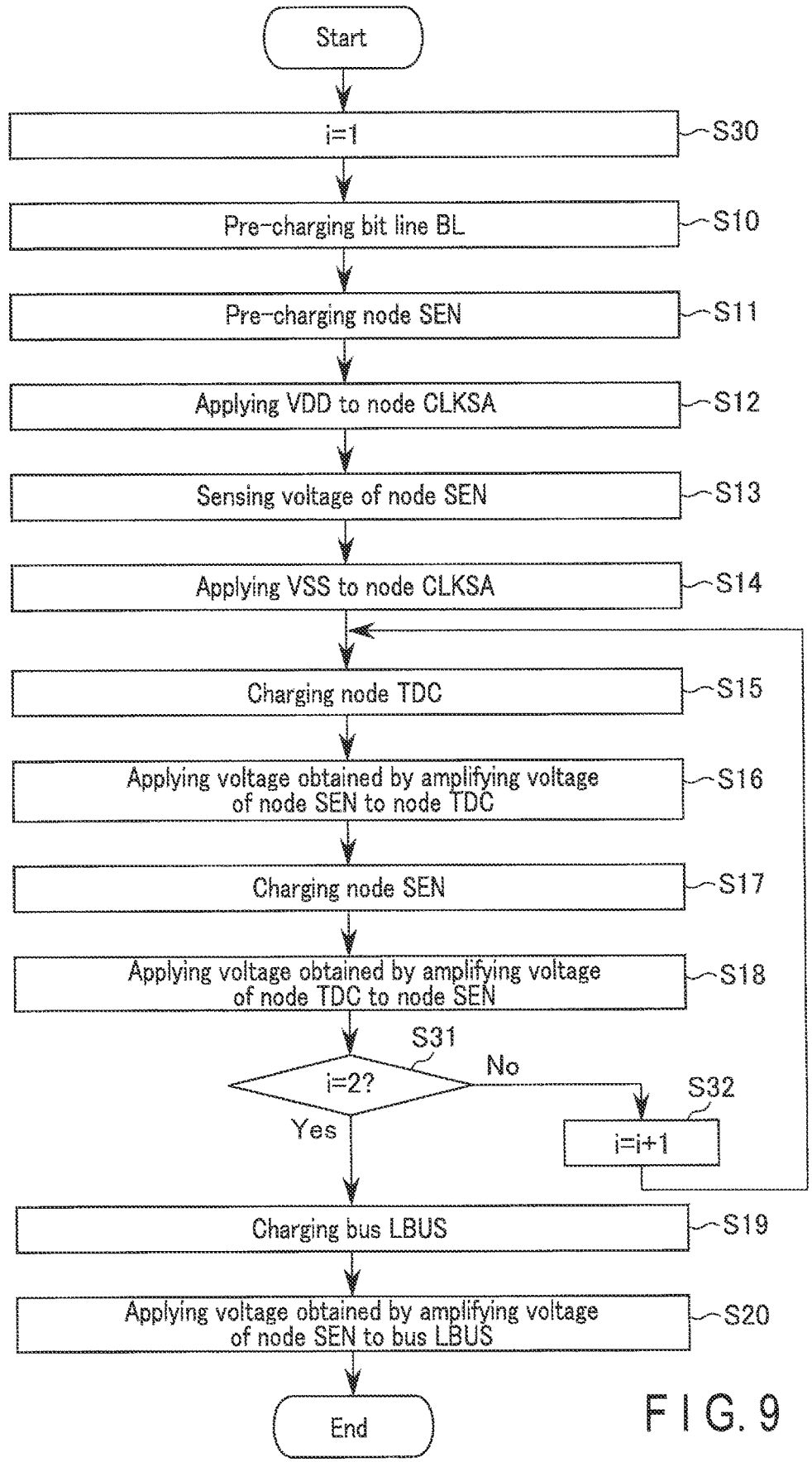
FIG. 9 is a flowchart showing a read operation of a NAND flash memory according to a second embodiment.
Figure 10:
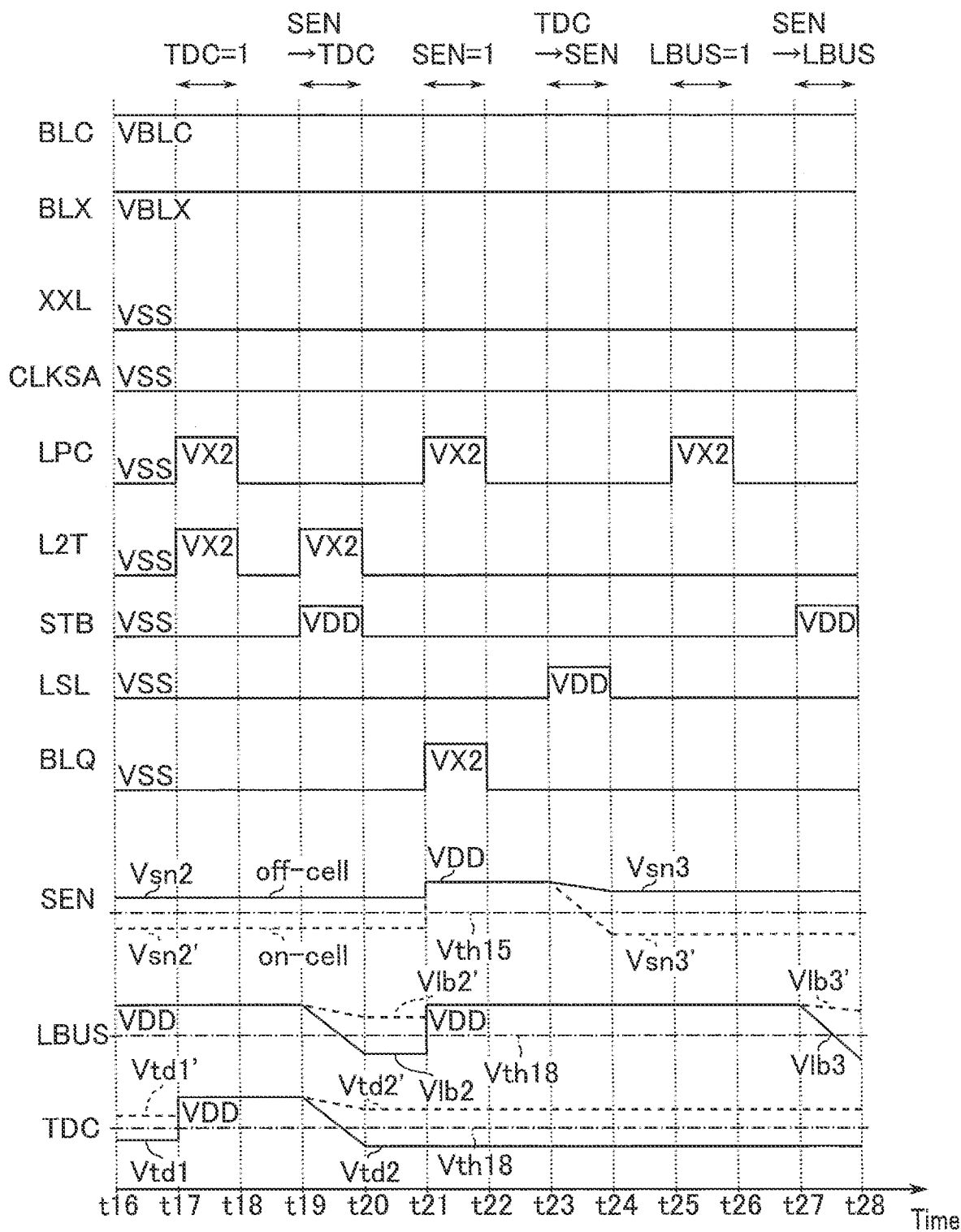
FIG. 10 is a timing chart showing voltages of various signals, etc. during the read operation of the NAND flash memory according to the second embodiment.

A read operation of the NAND flash memory 1 according to the present embodiment will be described with reference to FIG. 9 and FIG. 10. FIG. 9 is a flowchart showing the read operation of the NAND flash memory 1 according to the present embodiment. FIG. 10 is a timing chart showing voltages of various signals, etc., during a read operation of the NAND flash memory 1 according to the present embodiment.

When the memory cell transistor MC which is a read target is selected, the control circuit 3 sets i=1 (S30). Next, the sense amplifier 6 performs S10 to S18 described in the above, as in the first embodiment. Voltages of various signals, etc. from S10 to S18 are controlled in the same manner as in the period from time t1 to time t16 in FIGS. 7 and 8 showing the first embodiment.

After S18 is performed, the control circuit 3 determines whether or not i=2 (S31) is established. In the case where i=2 (S31) is not established (No in S31), the control circuit 3 increments i to set i=i+1 (S32), and performs S15. As shown in FIG. 10, at time t17, the control circuit 3 raises the signals LPC and L2T from the "L" level (VSS) to the "H" level (VX2). Accordingly, the transistors 20 and 21 are turned on, and the node TDC and the bus LBUS are charged to the "H" level (VDD). At time t18, the control circuit 3 drops the signals LPC and L2T from the "H" level (VX2) to the "L" level (VSS). Accordingly, the transistors 20 and 21 are turned off, and the node TDC and the bus LBUS are maintained at the "H" level.

After S15 is performed, the sense amplifier 6 performs S16. As shown in FIG. 10, at time t19, the control circuit 3 raises the signal L2T from the "L" level (VSS) to the "H" level (VX2), and raises the signal STB from the "L" level (VSS) to the "H" level (VDD). Accordingly, the transistors 16 and the 21 are turned on. As a result, the transistor 15 corresponding to the off-cell is turned on based on a voltage difference between the voltage Vsn2 and the voltage Vth15, and the bus LBUS and the node TDC decrease in voltage. Voltages of the LBUS and the node TDC at this time are respectively referred to as Vlb2 and Vtd2. The voltages Vtd2 and Vsn2 satisfy the relation of Vtd2<Vsn2. On the other hand, the transistor 15 corresponding to the on-cell is turned off based on a voltage difference between the voltage Vsn2' and the voltage Vth15, and the bus LBUS and the node TDC are maintained roughly at the voltage VDD. Voltages of the LBUS and the node TDC at this time are respectively referred to as Vlb2' and Vtd2'. The voltages Vtd2' and Vsn2' satisfy the relation of Vtd2'>Vsn2'. As a result, a voltage difference between the voltage Vth15 and the voltage Vsn2 and a voltage difference between the voltage Vth15 and the voltage Vsn2' are each amplified. In other words, a voltage difference between the voltage Vsn2 and the voltage Vsn2' is amplified to a voltage difference between the voltage Vtd2 and the voltage Vtd2'. At time t20, the control circuit 3 drops the signal L2T from the "H" level (VX2) to the "L" level (VSS), and drops the signal STB from the "H" level (VDD) to the "L" level (VSS). Accordingly, the transistors 16 and. 21 are turned off, and a voltage of the node TDC is maintained.

After S16 is performed, the sense amplifier 6 performs S17. As shown in FIG. 10, at time t21, the control circuit 3 raises the signals LPC and BLQ from the "L" level (VSS) to the "H" level (VX2). Accordingly, the transistors 17 and 20 are turned on, and the node SEN and the bus LBUS are charged to the "H" level (VDD). At time t22, the control circuit 3 drops the signals LPC and BLQ from the "H" level (VX2) to the "L" level (VSS). Accordingly, the transistors 17 and 20 are turned off, and the node SEN and the bus LBUS are maintained at the "H" level.

After S17 is performed, the sense amplifier 6 performs S18. As shown in FIG. 10, at time t23, the control circuit 3 raises the signal. LSL from the "L" level (VSS) to the "H" level (VDD). Accordingly, the transistor 19 is turned on. As a result, the transistor 18 corresponding to the off-cell is turned on based on a voltage difference between the voltage Vtd2 and the voltage Vth18, and the node SEN decreases in voltage. A voltage of the node SEN at this time will be referred to as Vsn3. The voltages Vsn3 and Vtd2 satisfy the relation of Vsn3>Vtd2. On the other hand, the transistor 18 corresponding to the on-cell is turned off based on a voltage difference between the voltage Vtd2' and the voltage Vth18, and the node SEN is maintained roughly at the voltage VDD. A voltage of the node SEN at this time will be referred to as Vsn3'. The voltages Vsn3' and Vtd2' satisfy the relation of Vsn3'<Vtd2'. As a result, a voltage difference between the voltage Vsn2 and the voltage Vsn2' is amplified (for example, amplified 100 times) to a voltage difference between the voltage Vsn3 and the voltage Vsn3'. At time t24, the control circuit 3 drops the signal LSL from the "H" level (VDD) to the "L" level (VS5). Accordingly, the transistor 19 is turned off, and a voltage of the node SEN is maintained.

On the other hand, in the case where i=2 is established (Yes in S31), the sense amplifier 6 performs S19 described in the above. As shown in FIG. 10, at time t25, the control circuit 3 raises the signal LPC from the "L" level (VSS) to the "H" level (VX2). Accordingly, the transistor 20 is turned on, and the bus LBUS is charged to the "H" level (VDD). At time t26, the control circuit 3 drops the signal LPC from the "H" level (VX2) to the "L" level (VSS). Accordingly, the transistor 20 is turned off, and the bus LBUS is maintained at the "H" level.

After S19 is performed, the sense amplifier 6 performs S20 described in the above. As shown in FIG. 10, at time t27, the control circuit 3 raises the signal STB from the "L" level (VSS) to the "H" level (VDD). Accordingly, the transistor 16 is turned on. As a result, the transistor 15 corresponding to the off-cell is turned on based on a voltage difference between the voltage Vsn3 and the voltage Vth15, and the bus LBUS decreases in voltage. A voltage of the bus LBUS at this time will be referred to as Vlb3. The voltages Vlb2 and Vlb3 satisfy the relation that Vlb2 is equal to or greater than Vlb3. On the other hand, the transistor 15 corresponding to the on-cell is turned off based on a voltage difference between the voltage Vsn3' and the voltage Vth15, and the bus LBUS is maintained roughly at the voltage VDD. A voltage of the bus LBUS at this time will be referred to as Vlb3'. The voltages Vlb2' and Vlb3' satisfy the relation that Vlb3' is equal to or greater than Vlb2'. At time t28, the control circuit 3 drops the signal STB from the "H" level (VDD) to the "L" level (VSS). Accordingly, the transistor 16 is turned off, and a voltage of the bus LBUS is maintained. As a result, a logical level of read data is confirmed. In the case where a voltage of the bus LBUS is the voltage Vlb3, it is determined that the bus LBUS stores data at the "L" level. In the case where a voltage of the bus LBUS is the voltage Vlb3', it is determined that the bus LBUS stores data at the "H" level.

When a logical level of read data is confirmed, a logical operation using the confirmed logical level is performed as in the first embodiment. The confirmed logical level may be transferred to the latch circuit XDL.

2.2 Advantageous Effects

With the configuration according to the present embodiment, the same effects as the first embodiment can be achieved. With the configuration according to the present embodiment, in the read operation, the sense amplifier 6 performs the operation of amplifying a voltage of the node SEN twice. A voltage difference between a voltage of the node SEN and a threshold voltage of the transistor 15 having its gate coupled to the node SEN can be amplified twice. This makes it possible to prevent an erroneous determination at the time of digitizing.

3. Third Embodiment

The third embodiment will be described. The NAND flash memory 1 according to the present embodiment has the same configuration as that of the first embodiment. In the present embodiment, while applying a voltage obtained by amplifying a voltage of the node TDC to the node SEN in the first operation of amplifying a voltage of the node SEN in the second embodiment, the sense amplifier 6 applies a voltage obtained by amplifying a voltage of the node SEN to the node TDC in the second operation of amplifying a voltage of the node SEN. Hereinafter, the points different from the first embodiment and the second embodiment will be mainly described.

3.1 Read Operation

Figure 11:
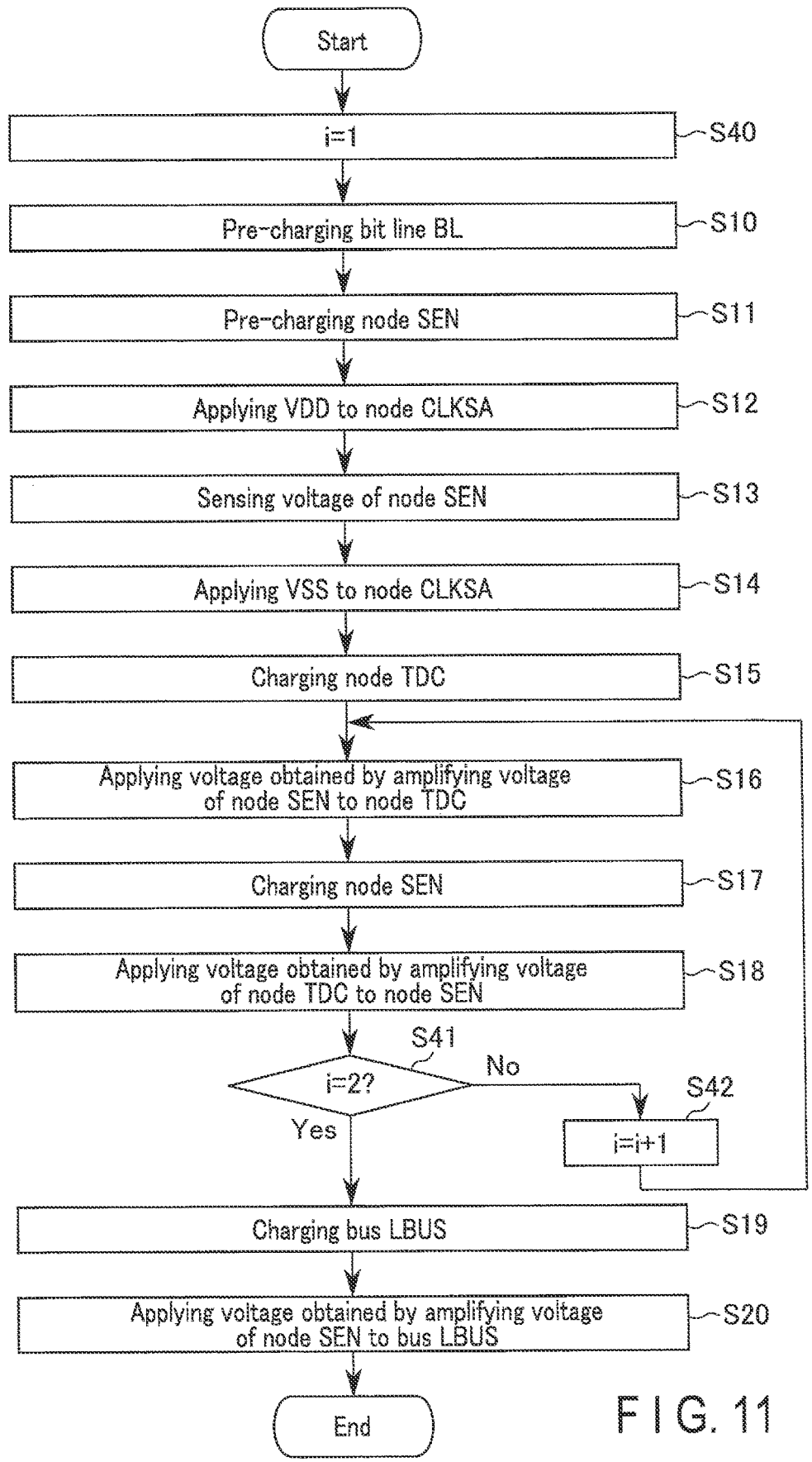
FIG. 11 is a flowchart showing a read operation of a NAND flash memory according to a third embodiment.
Figure 12:
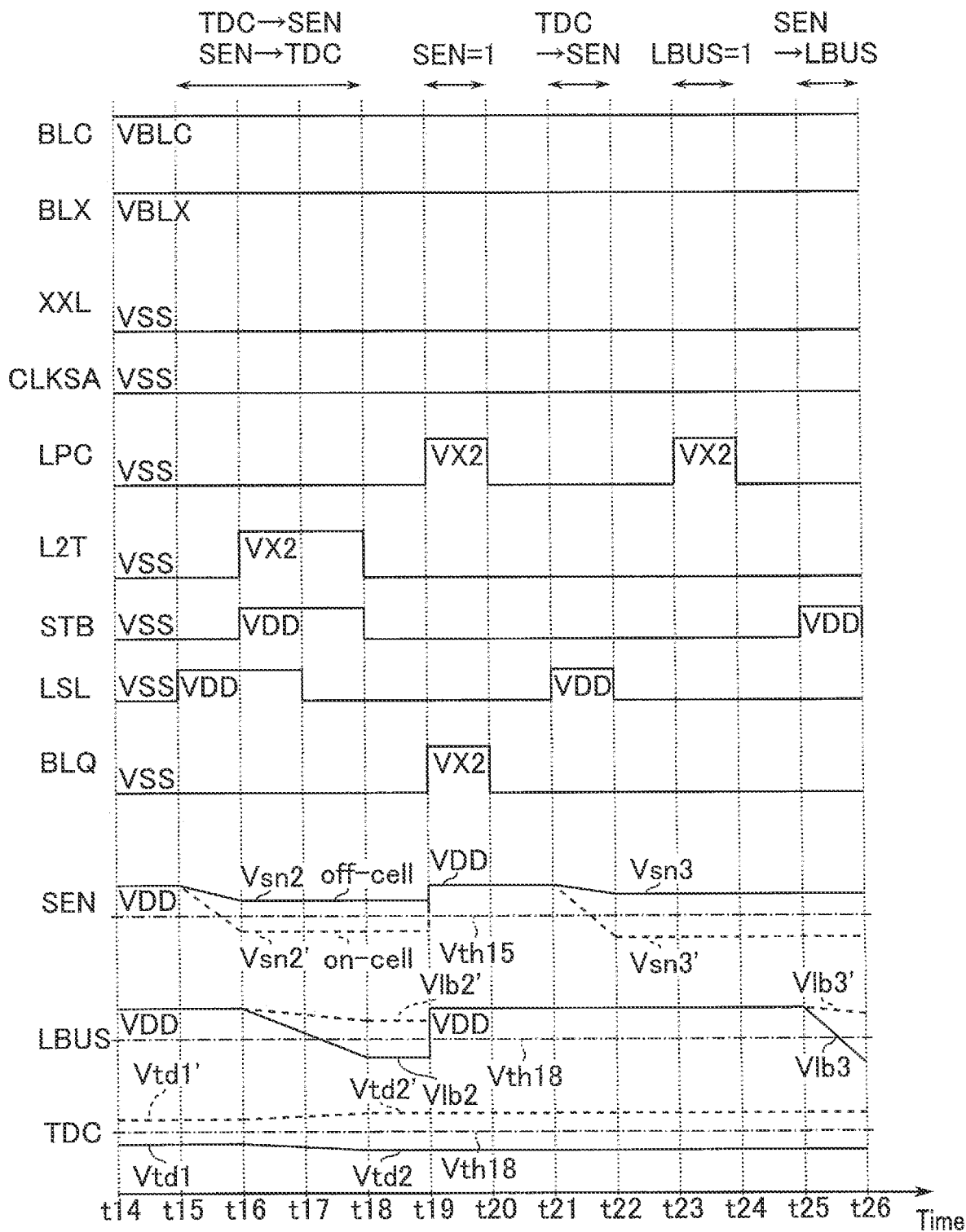
FIG. 12 is a timing chart showing voltages of various signals, etc. during the read operation of the NAND flash memory according to the third embodiment.

A read operation of the NAND flash memory 1 according to the present embodiment will be described with reference to FIG. 11 and FIG. 12. FIG. 11 is a flowchart showing the read operation of the NAND flash memory 1 according to the present embodiment. FIG. 12 is a timing chart showing voltages of various signals, etc., during a read operation of the RAND flash memory 1 according to the present embodiment.

When the memory cell transistor MC which is a read target is selected, the control circuit 3 sets i=1 (S40). Next, the sense amplifier 6 performs S10 to S17 described in the above, as in the first embodiment. Voltages of various signals, etc. from S10 to S17 are controlled in the same manner as in the period from time t1 to time t14 in FIGS. 7 and 8 showing the first embodiment.

After S17 is performed, the sense amplifier 6 performs S18 described in the above. As shown in FIG. 12, at time t15, the control circuit 3 raises the signal LSL from the "L" level (VSS) to the "H" level (VDD). Accordingly, the transistor 19 is turned on. As a result, the transistor 18 corresponding to the off-cell is turned on based on a voltage difference between the voltage Vtd1 and the voltage Vth18, and the node SEN decreases in voltage. A voltage of the node SEN at this time will be referred to as Vsn2. The voltages Vsn2 and Vtd1 satisfy the relation of Vsn2>Vtd1. On the other hand, the transistor 18 corresponding to the on-cell is turned off based on a voltage difference between the voltage Vtd1' and the voltage Vth18, and the node SEN is maintained roughly at the voltage VDD. A voltage of the node SEN at this time will be referred to as Vsn2'. The voltages Vsn2' and Vtd1' satisfy the relation of Vsn2'<Vtd1'. As a result, voltage difference between the voltage Vsn1 and the voltage Vsn1' is amplified (for example, amplified 100 times) to a voltage difference between the voltage Vsn2 and the voltage Vsn2'. At time t17, the control circuit 3 drops the signal LSL from the "H" level (VDD) to the "L" level (VSS). Accordingly, the transistor 19 is turned off, and a voltage of the node SEN is maintained.

After S18 is initiated, the control circuit 3 determines whether or not i=2 is established (S41). In the case where i=2 is not established (No in S41), the control circuit 3 increments i to set i=i+1 (S42), and performs S16. As shown in FIG. 12, at time t16, the control circuit 3 raises the signal L2T from the "L" level (VSS) to the "H" level (VX2), and raises the signal 5TH from the "L" level (VSS) to the "H" level (VDD). Accordingly, the transistors 16 and the 21 are turned on. As a result, the transistor 15 corresponding to the off-cell is turned on based on a voltage difference between the voltage Vth15 and the voltage Vsn2, and the bus LBUS decreases in voltage while the node TDC increases in voltage. Voltages of the LBUS and the node TDC at this time are respectively referred to as Vlb2 and Vtd2. The voltages Vtd2 and Vsn2 satisfy the relation of Vtd2<Vsn2. On the other hand, the transistor 15 corresponding to the on-cell is turned off based on a voltage difference between the voltage Vsn2' and the voltage Vth15, and the bus LBUS and the node TDC are maintained roughly at the voltage VDD. Voltages of the LBUS and the node TDC at this time are respectively referred to as Vlb2' and Vtd2'. The voltages Vtd2' and Vsn2' satisfy the relation of Vtd2'>Vsn2'. As a result, a voltage difference between the voltage Vth15 and the voltage Vsn2 and a voltage difference between the voltage Vth15 and the voltage Vsn2' are respectively amplified. In other words, a voltage difference between the voltage Vsn2 and the voltage Vsn2' is amplified to a voltage difference between the voltage Vtd2 and the voltage Vtd2'. At time t18, the control circuit 3 drops the signal L2T from the "H" level (VX2) to the "L" level (VSS), and drops the signal STB from the "H" level (VDD) to the "L" level (VSS). Accordingly, the transistors 16 and 21 are turned off, and a voltage of the node TDC is maintained.

After S16 is performed, the sense amplifier 6 performs S17. As shown in FIG. 12, at time t19, the control circuit 3 raises the signals LPC and BLQ from the "L" level (VSS) to the "H" level (VX2). Accordingly, the transistors 17 and 20 are turned on, and the node SEN and the bus LBUS are charged to the "H" level (VDD). At time t20, the control circuit 3 drops the signals LPC and BLQ from the "H" level (VX2) to the "L" level (VSS). Accordingly, the transistors 17 and 20 are turned off, and the node SEN and the bus LBUS are maintained at the "H" level.

After S17 is performed, the sense amplifier 6 performs S18. As shown in FIG. 12, at time t21, the control circuit 3 raises the signal LSL from the "L" level (VSS) to the "H" level (VDD). Accordingly, the transistor 19 is turned on. As a result, the transistor 18 corresponding to the off-cell is turned on based on a voltage difference between the voltage Vtd2 and the voltage Vth18, and the node SEN decreases in voltage. A voltage of the node SEN at this time will be referred to as Vsn3. The voltages Vsn3 and Vtd2 satisfy the relation of Vsn3>Vtd2. On the other hand, the transistor 18 corresponding to the on-cell is turned off based on a voltage difference between the voltage Vtd2' and the voltage Vth18, and the node SEN is maintained roughly at the voltage VDD. A voltage of the node SEN at this time will be referred to as Vsn3'. The voltages Vsn3' and Vtd2' satisfy the relation of Vsn3'<Vtd2'. As a result, a voltage difference between the voltage Vsn2 and the voltage Vsn2' is amplified (for example, amplified 100 times) to a voltage difference between the voltage Vsn3 and the voltage Vsn3'. At time t22, the control circuit 3 drops the signal LSL from the "H" level (VDD) to the "L" level (VSS). Accordingly, the transistor 19 is turned off, and a voltage of the node SEN is maintained.

On the other hand, in the case where i=2 is established (Yes in S41), the sense amplifier 6 performs S19 described in the above. As shown in FIG. 12, at time t23, the control circuit 3 raises the signal LPC from the "L" level (VSS) to the "H" level (VX2). Accordingly, the transistor 20 is turned on, and the bus LBUS is charged to the "H" level (VDD). At time t24, the control circuit 3 drops the signal LPC from the "H" level (VX2) to the "L" level (VSS). Accordingly, the transistor 20 is turned off, and the bus LBUS is maintained at the "H" level.

After S19 is performed, the sense amplifier 6 performs S20 described in the above. As shown in FIG. 12, at time t25, the control circuit 3 raises the signal STB from the "L" level (VSS) to the "H" level (VDD). Accordingly, the transistor 16 is turned on. As a result, the transistor 15 corresponding to the off-cell is turned on based on a voltage difference between the voltage Vsn3 and the voltage Vth15, and the bus LBUS decreases in voltage. A voltage of the bus LBUS at this time will be referred to as Vlb3. The voltages Vlb2 and Vlb3 satisfy the relation that Vlb2 is equal to or greater than Vlb3. On the other hand, the transistor 15 corresponding to the on-cell is turned off based on a voltage difference between the voltage Vsn3' and the voltage Vth15, and the bus LBUS is maintained roughly at the voltage VDD. A voltage of the bus LBUS at this time will be referred to as Vlb3'. The voltages Vlb2' and Vlb3' satisfy the relation that Vlb3' is equal to or greater than Vlb2'. At time t26, the control circuit 3 drops the signal STB from the "H" level (VDD) to the "L" level (VSS). Accordingly, the transistor 16 is turned off, and a voltage of bus LBUS is maintained. As a result, a logical level of read data is confirmed. In the case where a voltage of the bus LBUS is the voltage Vlb3, it is determined that the bus LBUS stores data at the "L" level. In the case where a voltage of the bus LBUS is the voltage Vlb3', it is determined that the bus LBUS stores data at the "H" level.

When a logical level of read data is confirmed, a logical operation using the confirmed logical level is performed as in the first embodiment. The confirmed logical level may be transferred to the latch circuit XDL.

3.2 Advantageous Effects

With the configuration according to the present embodiment, the same effects as the second embodiment can be achieved. With the configuration according to the present embodiment, in the read operation, while applying a voltage obtained by amplifying a voltage of the node TDC to the node SEN in the first operation of amplifying a voltage of the node SEN, the sense amplifier 6 applies a voltage obtained by amplifying a voltage of the node SEN to the node TDC in the second operation of amplifying a voltage of the node SEN. This enables digitizing to be performed without charging the node TDC between the first operation of amplifying a voltage of the node SEN and the second operation of amplifying a voltage of the node SEN. This achieves reduction of a time required for digitizing.

4. Fourth Embodiment

The fourth embodiment will be described. The present embodiment eliminates the transistor 21 and the capacitance element 25 and adds an n channel MOS transistor 26 with respect to the sense amplifier unit SAU included in the NAND flash memory 1 according to the first embodiment. Hereinafter, the points different from the first embodiment will be mainly described.

4.1 Circuit Configuration of Sense Amplifier Unit SAU

Figure 13:
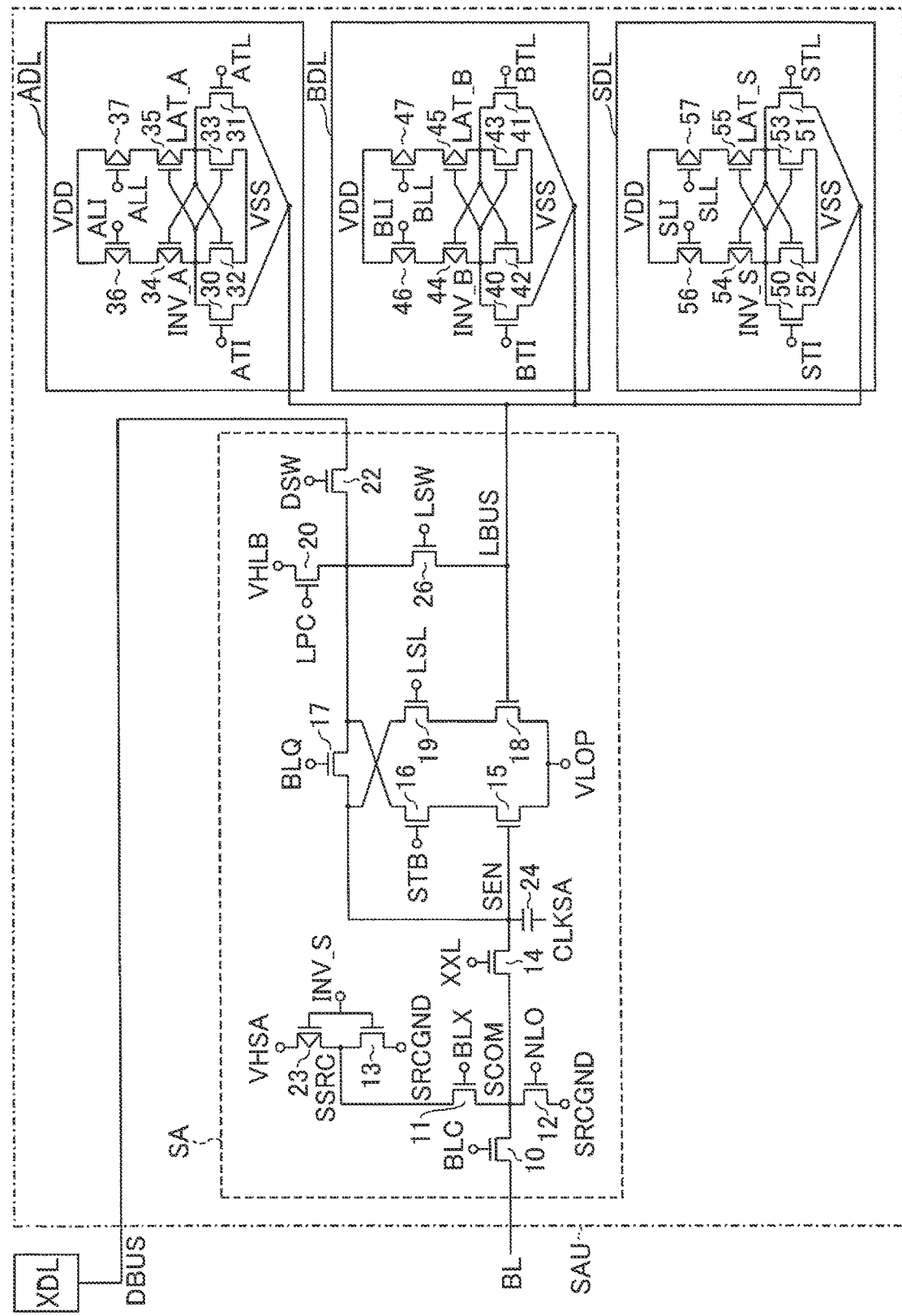
FIG. 13 is a circuit diagram of a sense amplifier unit included in a NAND flash memory according to a fourth embodiment.

A circuit configuration of the sense amplifier unit SAU will be described with reference to FIG. 13. FIG. 13 is circuit diagram of the sense amplifier unit SAU included in the NAND flash memory 1 according to the present embodiment.

FIG. 13 shows an exemplary circuit configuration of the sense amplifier unit SAU by extracting one of the sense amplifier units SAU included in the sense amplifier 6. All of the other sense amplifier units SAU also have the configuration shown in FIG. 13.

The sense circuit SA includes the n-channel MOS transistors 10 to 20, 22, and 26, the p-channel MOS transistor 23, and the capacitance element 24.

The transistor 26 is configured in such a manner that a signal LSW is input to a gate, and one end of a current path is coupled to the bus LBUS. The transistor 17 is configured in such a manner that the signal BLQ is input to a gate, and one end of a current path is coupled to the node SEN and the other end of the current path is coupled to the other end of a current path of the transistor 26. The transistor 18 is configured in such a manner that a gate is coupled to the bus LBUS, and one end of a current path is coupled to one end of a current path of the transistor 19 and the voltage VLOP is applied to the other end of the current path of the transistor 18. The transistor 20 is configured in such a manner that the signal LPC is input to a gate, and one end of a current path is coupled to the other end of the current path of the transistor 26 and the voltage VHLB is applied to the other end of the current path of the transistor 20. The transistor 22 is configured in such a manner that the signal DSW is input to a gate, and one end of a current path is coupled to the other end of the current path of the transistor 26 and the other end of the current path of the transistor 22 is coupled to the bus DBUS. The other configurations of the sense circuit SA are the same as those of the first embodiment shown in FIG. 5.

4.2 Read Operation

Figure 14:
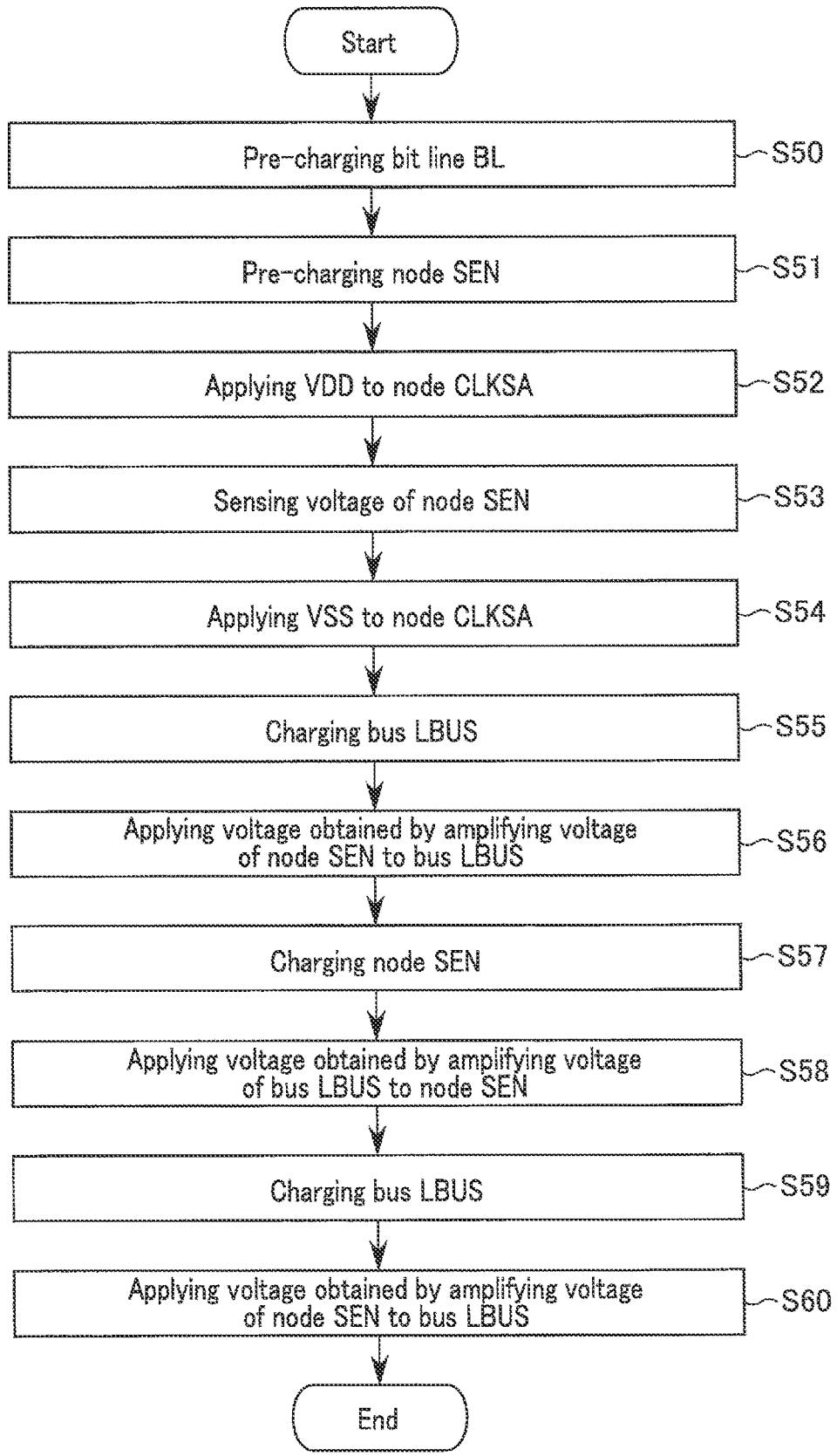
FIG. 14 is a flowchart showing a read operation of the NAND flash memory according to the fourth embodiment.

A read operation of the NAND flash memory 1 according to the present embodiment will be described with reference to FIG. 14 to FIG. 16. FIG. 14 is a flowchart showing the read operation of the NAND flash memory 1 according to the present embodiment. FIGS. 15 and 16 are each a timing chart showing voltages of various signals, etc., during a read operation of the NAND flash memory 1 according to the present embodiment.

When the memory transistor MC which is a read target is selected, the sense amplifier 6 pre-charges the bit line BL (S50). As shown in FIG. 15, at time t1, the control circuit 3 raises the signal BLC from the "L" level (VSS) to the "H" level (VBLC), and raises the signal BLX from the "L" level (VSS) to the "H" level (VBLX), as in the first embodiment. Accordingly, the transistors 10 and 11 are turned on, and the bit line BL is pre-charged. Pre-charging of the bit line BL is conducted during a period from time t1 to t5.

During pre-charging of the bit line BL, the sense amplifier 6 pre-charges the node SEN (S51). As shown in FIG. 15, at time t2, the control circuit 3 raises the signals LPC and BLQ from the "L" level (VSS) to the "H" level (VX2), as in the first embodiment. Accordingly, the transistors 17 and the 20 are turned on, and the node SEN is pre-charged to the "H" level (VDD). At time t3, the control circuit 3 drops the signals LPC and F3LQ from the "H" level (VX2) to the "L" level (VSS), as in the first embodiment. Accordingly, the transistors 17 and 20 are turned off, and the node SEN is maintained at the "H" level.

When the node SEN is pre-charged, the control circuit 3 applies the voltage VDDSA to the node CLKSA (S52). As shown in FIG. 15, at time t4, the control circuit 3 raises the voltage of the node CLKSA from the "L" level (VSS) to the "H" level (VDDSA), as in the first embodiment. As a result, the capacitance element 24 is charged, and a voltage of the node SEN rises to a voltage Vcu under the effect of capacitance coupling.

After the clock up is performed, the sense amplifier 6 senses a voltage of the node SEN (S53). As shown in FIG. 15, at time t5, the control circuit 3 raises the signal XXL from the "L" level (VSS) to the "H" level (VXXL), as in the first embodiment. In this state, in the case where a threshold voltage of the memory cell transistor which is a read target is equal to or greater than a read voltage (for example, VA, VB, VC, . . . ), the memory cell transistor MC is turned off (off-cell), and a voltage of the node SEN fluctuates very little. On the other hand, in the case where a threshold voltage of the memory cell transistor MC which is a read target is lower than a read voltage, the memory cell transistor MC is turned on (on-cell), and the node SEN decreases in voltage. At time t6, the control circuit 3 drops the signal XXL from the "H" level (VXXL) to the "L" level (VSS), as in the first embodiment.

When a voltage of the node SEN is sensed, the control circuit 3 applies the voltage VSS to the node CLKSA (S54). As shown in FIG. 15, at time t7, the control circuit 3 drops a voltage of the node CLKSA from the "H" level (VDD) to the "L" level (VSS), as in the first embodiment. As a result, a voltage of the node SEN decreases under the effect of capacitance coupling. Specifically, as shown in FIG. 15, a voltage of the node SEN corresponding to the off-cell becomes Vsn1 (Vth15 or greater and VDD or lower). Furthermore, a voltage of the node SEN corresponding to the on-cell becomes Vsn1' (VSS or greater and lower than Vth15).

After the clock down is performed, the sense amplifier 6 charges the bus LBUS (S55). As shown in FIG. 16, at time t9, the control circuit 3 raises the signals LPC and LSW from the "L" level (VSS) to the "H" level (VX2). Accordingly, the transistors 20 and 26 are turned on, and the bus LBUS is charged to the "H" level (VDD). At time t10, the control circuit 3 drops the signals LPC and LSW from the "H" level (VX2) to the "L" level (VSS). Accordingly, the transistors 20 and 26 are turned off, and the bus LBUS is maintained at the "H" level. The bus LBUS takes on a given value within a range of VSS or greater and VDD or lower during a period from time t1 to time t2.

When the node LBUS is charged, the sense amplifier 6 applies, to the bus LBUS, a voltage obtained by amplifying a voltage of the node SEN (S56). As shown in FIG. 16, at time t11, the control circuit 3 raises the signal LSW from the "L" level (VSS) to the "H" level (VX2), and raises the signal STB from the "L" level (VSS) to the "H" level (VDD). Accordingly, the transistors 16 and the 26 are turned on. As a result, the transistor 15 corresponding to the off-cell is turned to a weak ON state based on a voltage difference between the voltage Vsn1 and the voltage Vth15, and the bus LBUS decreases in voltage. A voltage of the bus LBUS at this time will be referred to as Vlb1. The voltages Vlb1 and1 Vsn1 satisfy the relation of Vlb1<Vsn1. On the other hand, the transistor 15 corresponding to the on-cell is turned to a weak OFF state based on a voltage difference between the voltage Vsn1' and the voltage Vth15, and the bus LBUS is maintained roughly at the voltage VDD (or has a slight decrease in voltage). A voltage of the bus LBUS at this time will be referred to as Vlb1'. The voltages Vlb1' and Vsn1' satisfy the relation of Vlb1'>Vsn1'. As a result, a voltage difference between the voltage Vth15 and the voltage Vsn1 and a voltage difference between the voltage Vth15 and the voltage Vsn1' are respectively amplified. In other words, a voltage difference between the voltage Vsn1 and the voltage Vsn1' is amplified to a voltage difference between the voltage Vlb1 and the voltage Vlb1'. At time t12, the control circuit 3 drops the signal LSW from the "H" level (VX2) to the "L" level (VSS), and drops the signal STB from the "H" level (VDD) to the "L" level (VSS). Accordingly, the transistors 16 and 26 are turned off, and a voltage of the bus LBUS is maintained.

When a voltage obtained by amplifying a voltage of the node SEN is applied to the node LBUS, the sense amplifier 6 charges the node SEN (S57). As shown in FIG. 16, at time t13, the control circuit 3 raises the signals LPC and BLQ from the "L" level (VSS) to the "H" level (VX2), as in the first embodiment. Accordingly, the transistors 17 and 20 are turned on, and the node SEN is charged to the "H" level (VDD). At time t14, the control circuit 3 drops the signals LPC and BLQ from the "H" level (VX2) to the "L" level (VSS), as in the first embodiment. Accordingly, the transistors 17 and 20 are turned off, and the node SEN is maintained at the "H" level.

When the node SEN is charged, the sense amplifier 6 applies, to the node SEN, a voltage obtained by amplifying a voltage of the bus LBUS (S58). As shown in FIG. 16, at time t15, the control circuit 3 raises the signal LSL from the "L" level (VSS) to the "H" level (VDD), as in the first embodiment. Accordingly, the transistor 19 is turned on. As a result, the transistor 18 corresponding to the off-cell is turned on based on a voltage difference between the voltage Vtd1 and the voltage Vth18, and the node SEN decreases in voltage. A voltage of the node SEN at this time will be referred to as Vsn2. The voltages Vsn2 and Vtd1 satisfy the relation of Vsn2>Vtd1. On the other hand, the transistor 18 corresponding to the on-cell is turned off based on a voltage difference between the voltage Vtd1' and the voltage Vth18, and the node SEN is maintained roughly at the voltage VDD. A voltage of the node SEN at this time will be referred to as Vsn2'. The voltages Vsn2' and Vtd1' satisfy the relation of Vsn2'<Vtd1'. As a result, a voltage difference between the voltage Vsn1 and the voltage Vsn1' is amplified (for example, amplified 100 times) to a voltage difference between the voltage Vsn2 and the voltage Vsn2'. At time t16, the control circuit 3 drops the signal LSL from the "H" level (VDD) to the "L" level (VSS), as in the first embodiment. Accordingly, the transistor 19 is turned off, and a voltage of the node SEN is maintained.

When a voltage obtained by amplifying a voltage of the bus LBUS is applied to the node SEN, the sense amplifier 6 charges the bus LBUS (S59). As shown in FIG. 16, at time t17, the control circuit 3 raises the signals LPC and LSW from the "L" level (VSS) to the "H" level (VX2), as in S55 described in the above. In this manner, the transistors 20 and 26 are turned on, and the bus LBUS is charged to the "H" level (VDD). At time t18, the control circuit 3 drops the signals LPC and LSW from the "H" level (VX2) to the "L" level (VSS), as in S55 described in the above. Accordingly, the transistors 20 and 26 are turned off, and the bus LBUS is maintained at the "H" level.

When the bus LBUS is charged, the sense amplifier 6 applies, to the bus LBUS, a voltage obtained by amplifying a voltage of the node SEN (S60). As shown in FIG. 16, at time t19, the control circuit 3 raises the signal LSW from the "L" level (VSS) to the "H" level (VX2), and raises the signal STB from the "L" level (VSS) to the "H" level (VDD), as in S56 described in the above. Accordingly, the transistors 16 and the 26 are turned on. As a result, the transistor 15 corresponding to the off-cell is turned on based on a voltage difference between the voltage Vsn2 and the voltage Vth15, and the bus LBUS decreases in voltage. A voltage of the bus LBUS at this time will be referred to as Vlb2. The voltages Vlb1 and Vlb2 satisfy the relation that Vlb1 is equal to or greater than Vlb2. On the other hand, the transistor 15 corresponding to the on-cell is turned off based on a voltage difference between the voltage Vsn2' and the voltage Vth15, and the bus LBUS is maintained roughly at the voltage VDD. A voltage of the bus LBUS at this time will be referred to as Vlb2'. The voltages Vlb1' and Vlb2' satisfy the relation that Vlb2' is equal to or greater than Vlb1'. At time 20, the control circuit 3 drops the signal LSW from the "H" level (VX2) to the "L" level (VSS), and drops the signal STB from the "H" level (VDD) to the "L" level (VSS) as in S56. Accordingly, the transistors 16 and 26 are turned off, and a voltage of the bus LBUS is maintained. As a result, a logical level of read data is confirmed. In the case where a voltage of the bus LBUS is the voltage Vlb2, it is determined that the bus LBUS stores data at the "L" level. In the case where a voltage of the bus LBUS is the voltage Vlb2', it is determined that the bus LBUS stores data at the "H" level.

When a logical level of read data is confirmed, a logical operation using the confirmed logical level is performed as in the first embodiment. The confirmed logical level may be transferred to the latch circuit XDL.

4.3 Advantageous Effects

With the configuration according to the present embodiment, the same effects as the first embodiment can be achieved.

5. Modifications, etc.

As described in the above, the semiconductor memory device according to an embodiment includes a memory cell (MC) configured to store data, a bit line (BL) electrically coupled to the memory cell, and a sense amplifier (6) electrically coupled to the bit line and including a first circuit (SA) and a latch circuit (S/A/BDL). The first circuit includes: a first node (SEN) which is configured to be electrically coupled to the bit line; a first transistor (15) in which a gate is coupled to the first node, and which is configured to be coupled to a second node (LBUS) coupled to the latch circuit; a second transistor (21) configured to couple the second node and a third node (TDC); and a third transistor (18) in which a gate is coupled to the third node, and which is configured to be coupled to the first node. The sense amplifier senses a first voltage of the first node (SEN) at a time when charge is transferred to the bit line in a read operation, applies a second voltage obtained by amplifying the first voltage to the third node (TDC), and applies a third voltage obtained by amplifying the second voltage to the first node (SEN).

The embodiments are not limited to the above-described embodiments, and various modifications can be made.

5.1 First Modification

The first modification will be described. The present modification corresponds to the second embodiment modified by applying the fourth embodiment thereto. The flowchart showing the read operation in the present modification corresponds to the flowchart of the second embodiment shown in FIG. 9 modified in such a manner that S10 to S20 in FIG. 9 are replaced with S50 to S60 of the fourth embodiment shown in FIG. 14. In the present modification, voltages of various signals, etc. in S30 and S50 to S58 are controlled in the same manner as in the period from time t1 to time t16 in FIGS. 15 and 16 showing the fourth embodiment. After S58 is performed, voltages of various signals, etc. in S31, S32, and S55 to S60 are controlled in the same manner as in the period from time t16 to time t28 in FIG. 10 showing the second embodiment. In the period after time t16, the signal LSW is raised to VX2 at time t17 and is dropped to VSS at time t18 (charging of the bus LBUS). The signal LSW is raised to VX2 at time t19 and is dropped to VSS at time t20 (application of a voltage obtained by amplifying a voltage of the node SEN to the bus LBUS). The signal LSW is raised to VX2 at time t25 and is dropped to VSS at time t26 (charging of the bus LBUS). The signal LSW is raised to VX2 at time t27 and is dropped to VSS at time t28 (application of a voltage obtained by amplifying a voltage of the node SEN to the bus LBUS). With the configuration according to the present modification, the same effects as the second embodiment can be achieved.

5.2 Second Modification

The second Modification will be described. The present modification corresponds to the third embodiment modified by applying the fourth embodiment thereto. The flowchart showing the read operation in the present modification corresponds to the flowchart of the third embodiment shown in FIG. 11 modified in such a manner that S10 to S20 in FIG. 11 are replaced with S50 to S60 of the fourth embodiment shown in FIG. 14. In the present modification, voltages of various signals, etc. in S40 and S50 to S57 are controlled in the same manner as in the period from time t1 to time t14 in FIGS. 15 and 16 showing the fourth embodiment. After S57 is performed, voltages of various signals, etc, in S58, S41, S42, and S58 to S60 are controlled in the same manner as in the period from time t14 to time t25 in FIG. 12 showing the third embodiment. In the period after time t14, the signal LSW is raised to VX2 at time t16 and is dropped to VSS at time t18 (application of a voltage obtained by amplifying a voltage of the node SEN to the bus LBUS). The signal LSW is raised to VX2 at time t23 and is dropped to VSS at time t24 (charging of the bus LBUS). The signal LSW is raised to VX2 at time t25 and is dropped to VSS at time t26 (application of a voltage obtained by amplifying a voltage of the node SEN to the bus LBUS). With the configuration according to the present modification, the same effects as the third embodiment can be achieved.

Furthermore, the order of the steps in the above-described flowchart may be altered in any manner possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell configured to store data;
    a bit line electrically coupled to the memory cell; and
    a sense amplifier electrically coupled to the bit line and including a first circuit and a latch circuit,
    wherein
    the first circuit includes:
        a first node which is configured to be electrically coupled to the bit line;
        a first transistor in which a gate is coupled to the first node, and which is configured to be coupled to a second node coupled to the latch circuit;
        a second transistor configured to couple the second node and a third node; and
        a third transistor in which a gate is coupled to the third node, and which is configured to be coupled to the first node, and
    the sense amplifier senses a first voltage of the first node at a time when charge is transferred to the bit line in a read operation, applies a second voltage obtained by amplifying the first voltage to the third node, and applies third voltage obtained by amplifying the second voltage to the first node.

2. The device according to claim 1, wherein the sense amplifier applies a fourth voltage obtained by amplifying the third voltage to the second node.

3. The device according to claim 1, wherein the sense amplifier applies a fourth voltage obtained by amplifying the third voltage to the third node, and applies a fifth voltage obtained by amplifying the fourth voltage to the first node.

4. The device according to claim 1, wherein while applying a fourth voltage obtained by amplifying the third voltage to the third node, the sense amplifier applies a fifth voltage obtained by amplifying the fourth voltage to the first node.

5. The device according to claim 3, wherein the sense amplifier applies a sixth voltage obtained by amplifying the fifth voltage to the second node.

6. The device according to claim 1, wherein
the first circuit further includes a fourth transistor configured to couple the first transistor and the second node, and
the second and fourth transistors are turned on when the second voltage is applied to the third node.

7. The device according to claim 1, wherein
the first circuit further includes a fifth transistor configured to couple the third transistor and the first node, and
the fifth transistor is turned on when the third voltage is applied to the first node.

8. A semiconductor memory device comprising:
a memory cell configured to store data;
a bit line electrically coupled to the memory cell;
a sense amplifier electrically coupled to the bit line and including a first circuit and a latch circuit,
wherein
the first circuit includes:
a first node which is configured to be electrically coupled to the bit line;
a first transistor in which a gate is coupled to the first node, and which is configured to be coupled to a second node coupled to the latch circuit;
a second transistor configured to couple the second node and the first transistor; and
a third transistor in which a gate is coupled to the second node, and which is configured to be coupled to the first node, and
the sense amplifier senses a first voltage of the first node at a time when charge is transferred to the bit line in a read operation, applies a second voltage obtained by amplifying the first voltage to the second node, and applies a third voltage obtained by amplifying the second voltage to the first node.

9. The device according to claim 8, wherein the sense amplifier applies a fourth voltage obtained by amplifying the third voltage to the second node.

10. The device according to claim 8, wherein the sense amplifier applies a fourth voltage obtained by amplifying the third voltage to the second node, and applies a fifth voltage obtained by amplifying the fourth voltage to the first node.

11. The device according to claim 8, wherein while applying a fourth voltage obtained by amplifying the third voltage to the second node, the sense amplifier applies a fifth voltage obtained by amplifying the fourth voltage to the first node.

12. The device according to claim 10, wherein the sense amplifier applies a sixth voltage obtained by amplifying the fifth voltage to the second node.

13. The device according to claim 8, wherein
the first circuit further includes a fourth transistor configured to couple the first transistor and the second transistor, and
the second and fourth transistors are turned on when the second voltage is applied to the second node.

14. The device according to claim 8, wherein
the first circuit further includes a fifth transistor configured to couple the third transistor and the first node, and
the fifth transistor is turned on when the third voltage is applied to the first node.

* * * * *